US006214631B1

(12) United States Patent
Burrows et al.

(10) Patent No.: US 6,214,631 B1
(45) Date of Patent: Apr. 10, 2001

(54) METHOD FOR PATTERNING LIGHT EMITTING DEVICES INCORPORATING A MOVABLE MASK

(75) Inventors: Paul E. Burrows, Princeton Junction; Stephen R. Forrest, Princeton; Vladimir Bulovic, Metuchen; Peifang Tian; Julie Brown, both of Princeton, all of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/182,636

(22) Filed: Oct. 30, 1998

(51) Int. Cl.[7] .................................................. H01L 21/00
(52) U.S. Cl. .............................. 438/22; 438/35; 438/79; 438/743
(58) Field of Search .................................................. 438/22

(56) References Cited

U.S. PATENT DOCUMENTS

| 4,335,161 | * | 6/1982 | Luo | 438/164 |
| 5,317,141 | * | 5/1994 | Thomas | 250/491.1 |
| 5,721,160 | | 2/1998 | Forrest et al. | 438/28 |
| 5,726,282 | * | 3/1998 | Jenekhe et al. | 528/337 |
| 5,741,431 | * | 4/1998 | Shih | 216/65 |
| 5,757,139 | * | 5/1998 | Forrest et al. | 315/169.3 |
| 5,917,280 | | 6/1999 | Burrows et al. | 315/506 |
| 5,953,587 | * | 9/1999 | Forrest et al. | 438/99 |

OTHER PUBLICATIONS

Miyaguchi et al., "Organic LED Full Color Passive–Matrix Display", 9th International Workshop on Inorganic and Organic Electroluminescence, Extended Abstracts, p. 137–140, Bend, Oregon, (Sep. 14–17, 1998).

U.S. application No. 08/977,205, filed Nov. 24, 1997, entitled "Method of Fabricating and Patterning Oleds".

* cited by examiner

Primary Examiner—Charles Bowers
Assistant Examiner—William M. Brewster
(74) Attorney, Agent, or Firm—Kenyon & Kenyon

(57) ABSTRACT

A method of fabricatng a device is provided. A shadow mask is positioned in a first position over a substrate. A first process is performed on the substrate through the shadow mask. After the first process is performed, the shadow mask is moved to a second position over the substrate, measured relative to the first position. After the shadow mask is moved to the second position, a second process is performed on the substrate through the shadow mask.

42 Claims, 19 Drawing Sheets

METHOD FOR PATTERNING LIGHT EMITTING DEVICES INCORPORATING A MOVABLE MASK

This invention was made with Government support under Contract No. f33615-94-1-1414, awarded by the Defense Advanced Research Projects Agency. The Government has certain rights in this invention.

FIELD OF THE INVENTION

The present invention relates to patterning methods for thin films, and more particularly to patterning methods using a shadow mask.

BACKGROUND OF THE INVENTION

Electronic devices may have several different layers made of different materials and/or having different geometries. Fabricating such devices usually involves the patterning of several layers of thin films on a substrate. The use of a shadow mask to deposit such patterned thin films on the substrate is well known to the art. A "shadow" mask is a mask having apertures through which material is deposited onto a substrate, as opposed to an optical mask, which is used to selectively expose photoresist on a substrate to radiation.

In most devices, it is important that each patterned layer is fabricated in a particular position relative to previously fabricated layers. This alignment between layers is usually achieved by reference to features on the substrate, such as alignment markers previously fabricated on the substrate, that can be matched with features on the mask, such as a similar alignment marker. However, the alignment process is usually repeated for each layer that has a pattern and/or position different from that of the previously deposited layer, and each alignment involves additional cost and effort.

Alignment usually involves moving the mask relative to the substrate while viewing alignment markers on the mask and substrate under a microscope. Assuming that the mask and substrate are parallel, there are three types of movement: x, y, and Θ, where x and y represent linear movement parallel to the plane of the mask and substrate, and Θ represents rotation in the plane of the substrate. Mechanisms are known to the art for achieving such movement with a great deal of accuracy. Modem semiconductor fabrication techniques can be used to control movement with an accuracy of about 0.1 micron. Stacked coarse and fine movement piezo electric materials can be used to achieve such movement on the order of hundreds of microns or more, with an accuracy measured in tenths of a micron. X-y translators, which have very fine screws that may be turned by hand or by step motors to move a stage, can be used to achieve such movement on the order of hundreds of microns with an accuracy measured in microns. It is anticipated that advances in technology will enable movement to be controlled with greater accuracy, and that such advances can be used with the present invention. A rough alignment, usually involving a stage that can be moved linearly and in rotation through the use of screws, may be performed to bring the misalignment between the mask and substrate within the range of motion of a more accurate alignment mechanism. While alignment processes may be automated to some degree, each alignment involves cost and effort. Also, each additional alignment may introduce errors into the device to be fabricated.

It is sometimes desirable to fabricate a device from multiple materials, where the different materials have similar, but not identical, shapes, sizes and/or positions. It is known to deposit two or more such materials through the same shadow mask. For example, Miyaguchi et al., *Organic LED Full Color Passive-Matrix Display,* 9th International Workshop on Inorganic and Organic Electroluminescence, Extended Abstracts p. 127, Bend, Oreg., Sep. 14–17, 1998, discloses a multi-color passive-matrix display that uses three different organic materials to emit three different colors of light. These different organic materials are sequentially deposited through the same shadow mask, where the mask is moved in between depositions. However, the reference does not disclose how the position of the mask controlled.

The position of layers deposited through the same photoresist may be varied by varying the angle from which deposition occurs, as described by Burrows et al., "Method of Fabricating and Patterning OLEDs," patent application Ser. No. 08/977,205, filed on Nov. 24, 1997, and Forrest et al., "Method for Deposition and Patterning of Organic Thin Film," patent application Ser. No. 08/976,666, filed on Nov. 24, 1997, which are incorporated by reference. However, it is difficult to achieve uniform deposition onto an angled substrate over a wide area, unless the source to substrate distance is much greater than the size of the substrate, which would require a very large vacuum chamber.

SUMMARY OF THE INVENTION

A method of fabricating a device is provided. A shadow mask is positioned in a first position over a substrate. A first process is performed on the substrate through the shadow mask. After the first process is performed, the shadow mask is moved to a second position over the substrate, measured relative to the first position. After the shadow mask is moved to the second position, a second process is performed on the substrate through the shadow mask.

DETAILED DESCRIPTION

The present invention will be described with reference to the illustrative embodiments in the following processes and drawing figures.

A method is provided for moving a shadow mask from a first position, at which a first process is performed on a substrate, to a second position, at which a second process is performed on the substrate. The first position is measured relative to features on the substrate, using alignment techniques known to the art. The second position is measured relative to the first position. "Measured relative to the first position" means that reference is not made to features on the substrate when the shadow mask is moved from the first position to the second position. Measuring the second position relative to the first position advantageously avoids the effort and cost of performing a second alignment relative to features on the substrate. Movement to a second position measured relative to a first position can be achieved through the use of any of a number of mechanisms known to the art. For example, mechanisms used to align masks and substrates, such as piezo electric materials and x-y translators, may be used to achieve such movement.

In addition, better accuracy may be obtainable when a second position is measured relative to a first position, as opposed to performing a new alignment for the second position and measuring the second position relative to the substrate.

Advantageously, the present invention may be used to deposit onto a substrate a number of layers having similar but not identical shapes and sizes from a direction approximately perpendicular to the substrate, without changing the angle from which deposition occurs, and without changing the shadow mask. As a result, it is possible to use known technology for achieving uniform deposition over a wide area to fabricate a large array of devices simultaneously.

TRIANGULAR GEOMETRY

Figure 1:
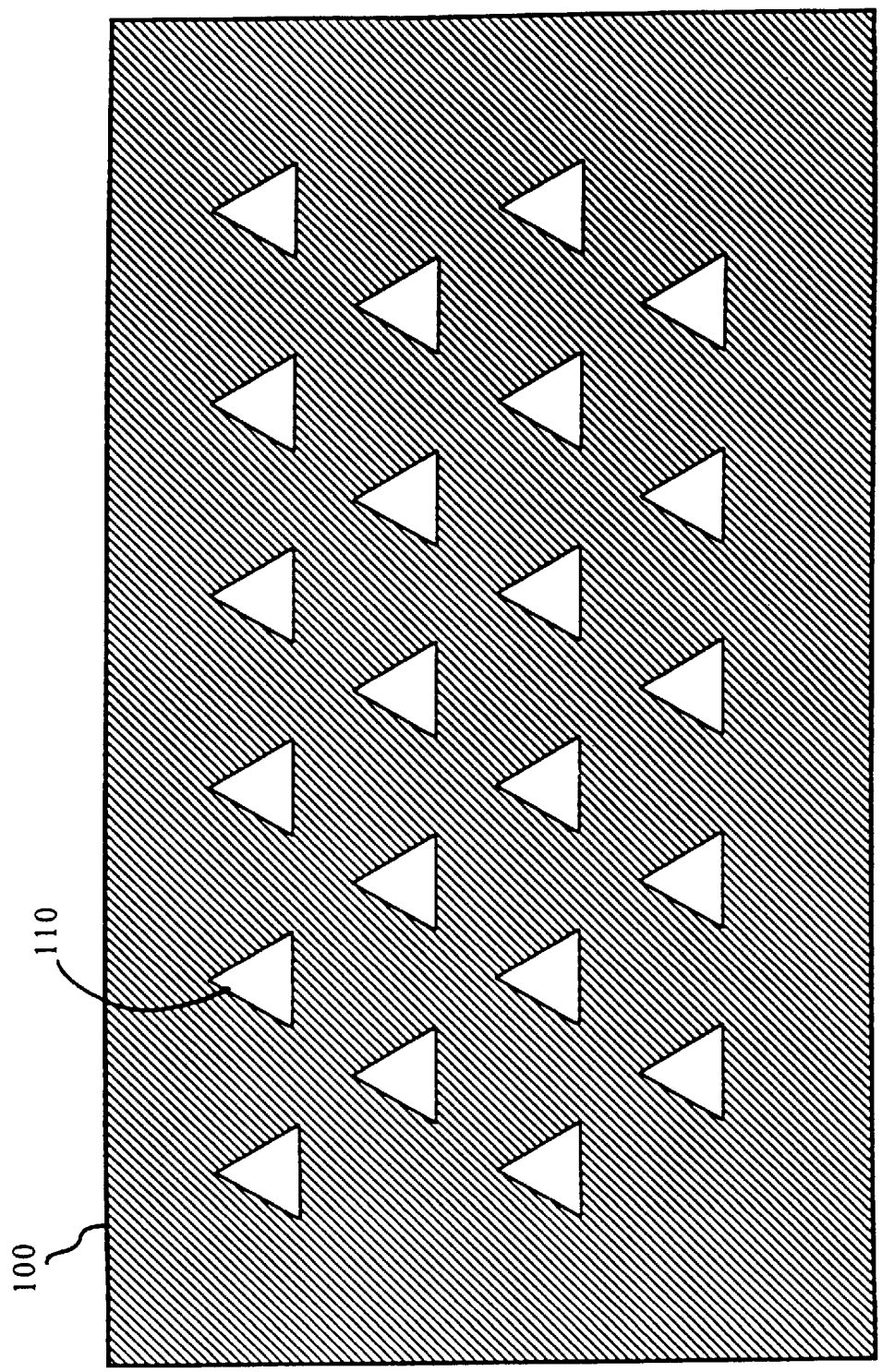
FIG. 1 shows a shadow mask adapted for use with a first embodiment of the present invention.

In a first embodiment of the invention, a shadow mask having triangular apertures is used to fabricate an array of SOLEDs having a triangular geometry. FIG. 1 shows a shadow mask 100 adapted for use in the first embodiment, and having a plurality of triangular apertures 110 of similar size, shape and alignment.

Figure 2:
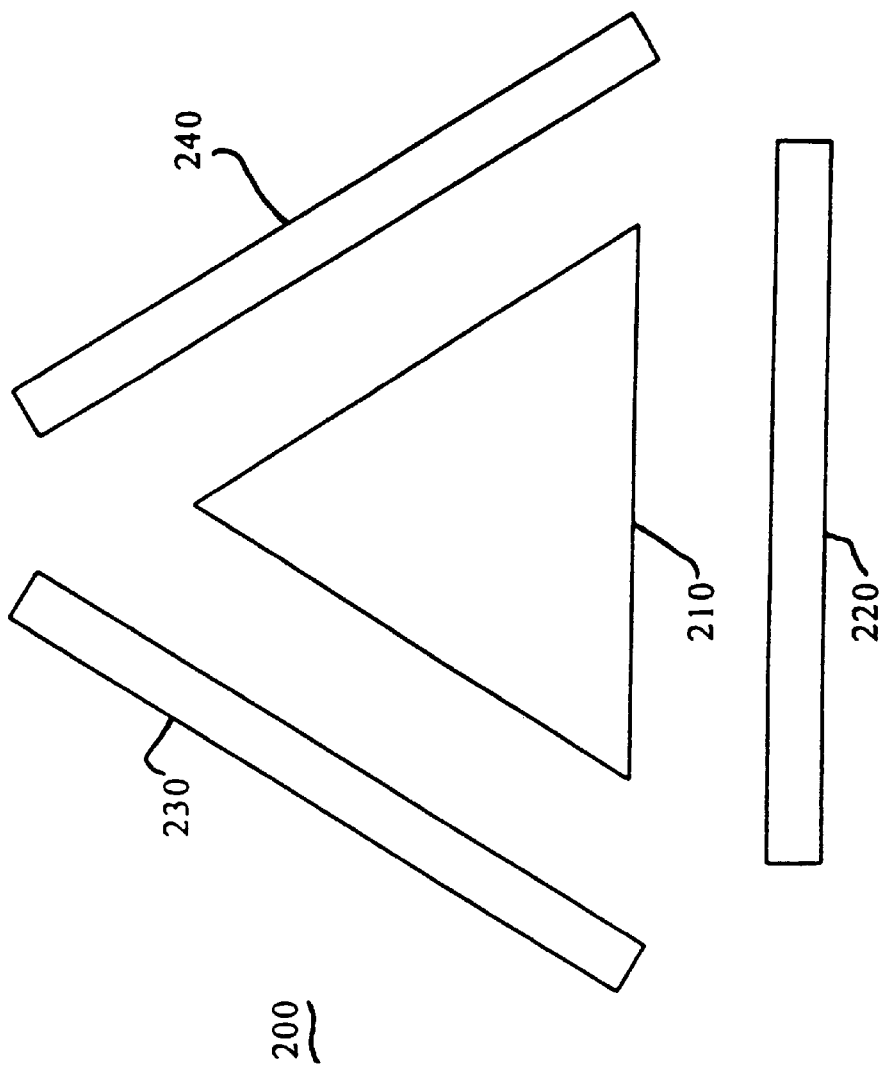
FIG. 2 shows contact pads on a substrate, adapted for use with the shadow mask of FIG. 1.

FIG. 2 shows contact pads on a substrate 200, adapted for use with shadow mask 100, over which one of the array of SOLEDs of the first embodiment may be fabricated. Substrate 200 has a triangular central contact pad 210, and three periphery contact pads 220, 230 and 240, where each periphery contact pad is positioned parallel to and a short distance away from a side of triangular contact pad 210. Preferably, central contact pad 210 is slightly smaller than triangular apertures 110, such that central contact pad 210 may be completely covered with material deposited through a triangular aperture 110 positioned directly over central contact pad 210. However, a central contact pad 210 larger than a triangular aperture 110 may be completely covered by material deposited through that triangular apertures 110, provided that shadow mask 100 is moved during deposition and/or positioned sufficiently far away from substrate 200 during deposition. Substrate 200 is preferably fabricated using techniques known to the art such that one of contact pads 210, 220, 230 and 240 is connected to ground, and the voltage at each of the other contact pads is independently controllable. An array of pixels, each having four contact pads similar to contact pads 210, 220, 230 and 240 may be fabricated using techniques known to the art, and the voltages at the different pads of the different pixels may be controlled using any of a number of indexing techniques, such as active matrix, passive matrix, or direct addressing.

Figure 3:
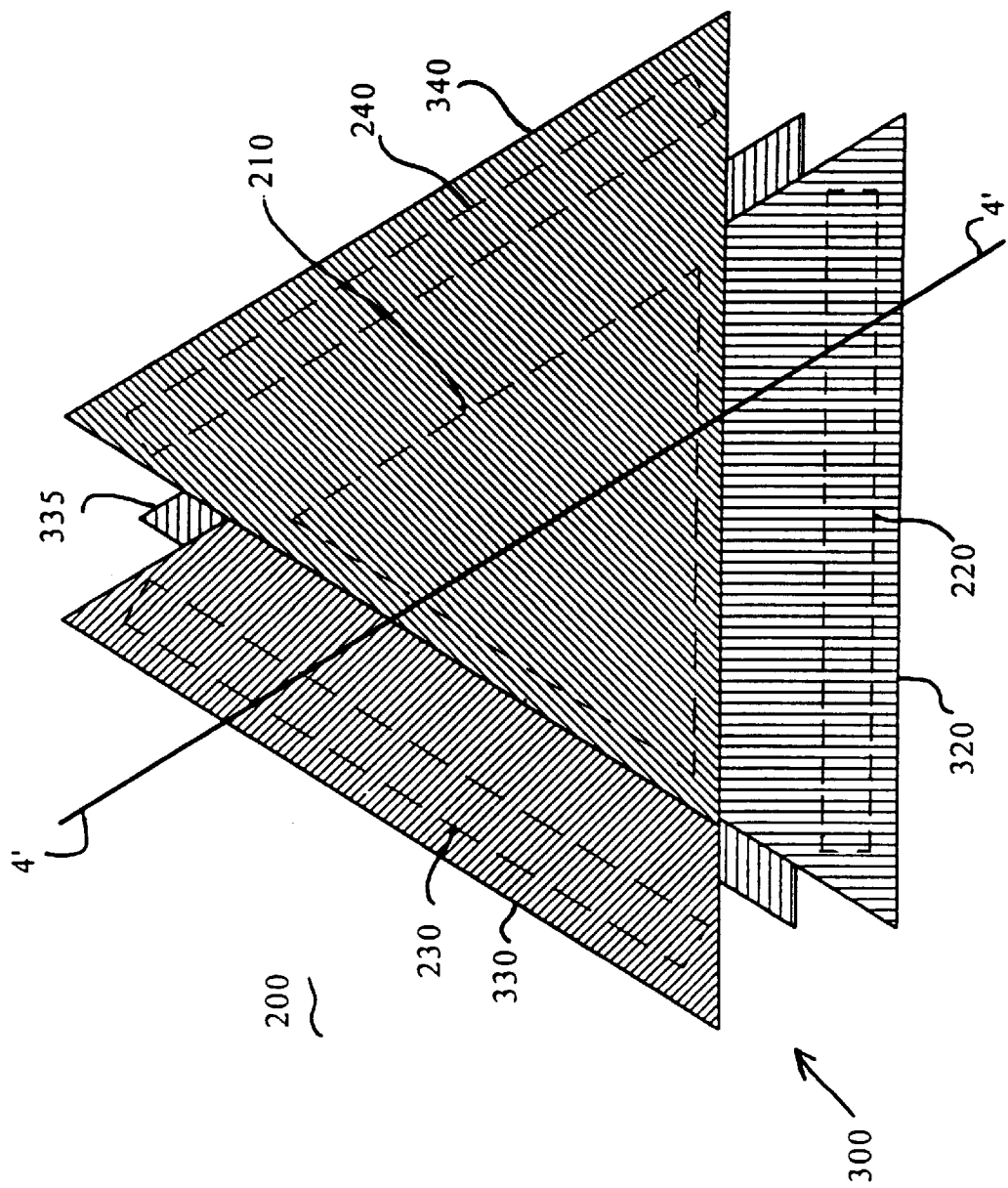
FIG. 3 shows a stacked organic light emitting device (SOLED) fabricated on top of the substrate of FIG. 2.
Figure 4:
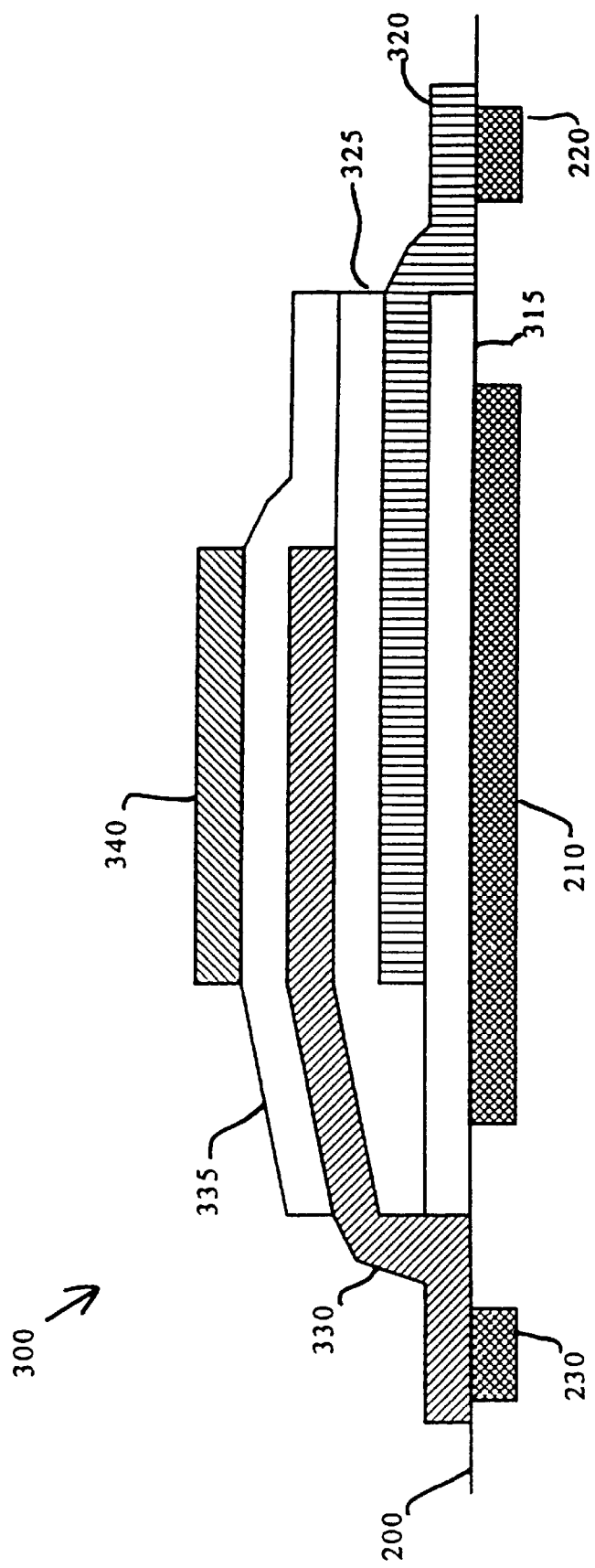
FIG. 4 shows a cross section of FIG. 3, taken through line 4' of FIG. 3

FIG. 3 shows a SOLED 300 fabricated on top of substrate 200, and FIG. 4 shows a cross section of FIG. 3, taken through line 4' of FIG. 3. SOLED 300 is one of the array of SOLEDs of the first embodiment, where the whole array may be fabricated simultaneously by using a shadow mask having multiple apertures, one for each SOLED.

SOLED 300 includes a first organic layer 315, a first electrode 320, a second organic layer 325, a second electrode 330, a third organic layer 335 and a third electrode 340, sequentially deposited in that order. In FIG. 3, organic layers 315 and 325 are not shown because they have the same size and shape as organic layer 335, and are disposed underneath organic layer 335. First electrode 320, second electrode 330 and third electrode 340 are electrically connected to periphery contact pads 220, 230 and 240, respectively. Each electrode is in contact with one and only one contact pad. Moreover, due to the triangular geometry of SOLED 300, there is no contact between electrodes. Each organic "layer" may actually include a plurality of organic layers, such as the emissive layer and hole transporting layer of a typical single heterostructure organic light emitting device, or the electron transporting layer, emissive layer and hole transporting layer of a double heterostructure organic light emitting device, as disclosed by U.S. Pat. No. 5,721,160, which is incorporated by reference.

SOLED 300 is adapted to emit light, preferably of three different colors, from each of first organic layer 315, second organic layer 325 and third organic layer 335. The color of the light emitted by a particular organic layer is determined by the structure and materials of that organic layer, as is known to the art. For example, U.S. Pat. No. 5,721,160, which is incorporated by reference, discloses typical red, green, and blue emitting materials. The intensity of the light emitted by a particular organic layer is determined by the current flowing through that organic. layer, which is in turn determined by the voltage applied across the organic layer. The voltage across each organic layer may be independently controlled by controlling the voltages at triangular contact pad 210, and at rectangular contact pads 220, 230 and 240, which are connected to electrodes 320, 330 and 340 respectively. As a result, SOLED 300 may serve as an R-G-B (red-green-blue) pixel, adapted to emit a wide variety of colors of varying intensity in the visible spectrum.

SOLED 300 is fabricated on substrate 200, using a shadow mask having triangular apertures such as shadow mask 100, as follows:

Step 1: Position a shadow mask in a first position over substrate 200, such that central contact pad 210 is centered in the aperture. The shadow mask may be aligned with the substrate using techniques known to the art.

Step 2: Deposit organic layer 315 through the shadow mask. The triangular aperture is preferably sufficiently large that organic layer 315 completely covers contact pad 210, yet not so large that contact pads other than contact pad 210 are covered.

Step 3: Move the shadow mask to a second position, measured relative to the first position.

Step 4: Deposit electrode 320 through the shadow mask. The second position should be selected such that electrode 320 contacts periphery contact pad 220, does not contact any contact pads other than periphery contact pad 220, and has a substantial overlap with organic layer 315.

Step 5: Move the shadow mask back to the first position, by movement relative to the second position.

Step 6: Deposit organic layer 325 through the shadow mask.

Step 7: Move the shadow mask to a third position, measured relative to the first position.

Step 8: Deposit electrode 330 through the shadow mask. The third position should be selected such that electrode 330 contacts periphery contact pad 230, does not contact any electrodes or contact pads other than periphery contact pad 220, and has a substantial overlap with organic layer 325.

Step 9: Move the shadow mask back to the first position, by movement relative to the third position.

Step 10: Deposit organic layer 335 through the shadow mask.

Step 11: Move the shadow mask to a fourth position, measured relative to the first position.

Step 12: Deposit electrode 340 through the shadow mask. The fourth position should be selected such that electrode 340 contacts periphery contact pad 240, does not contact any electrodes or contact pads other than periphery contact pad 240, and has a substantial overlap with organic layer 335.

Figure 5:
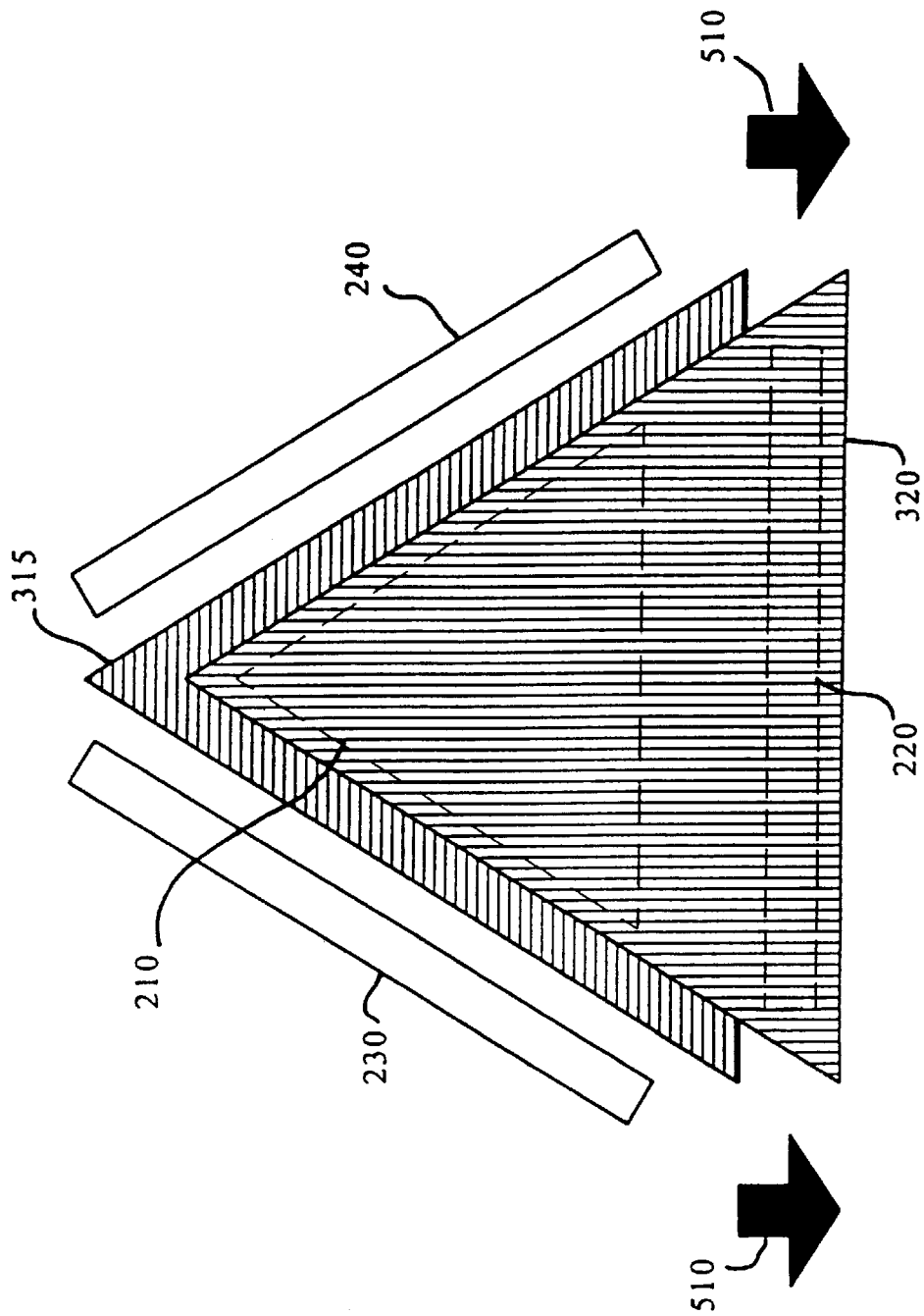
FIG. 5 shows the SOLED of FIG. 3, partially fabricated.

FIG. 5 shows the SOLED of FIG. 3 after step 4. Arrows 510 illustrates the movement of the shadow mask during step 3.

Figure 6:
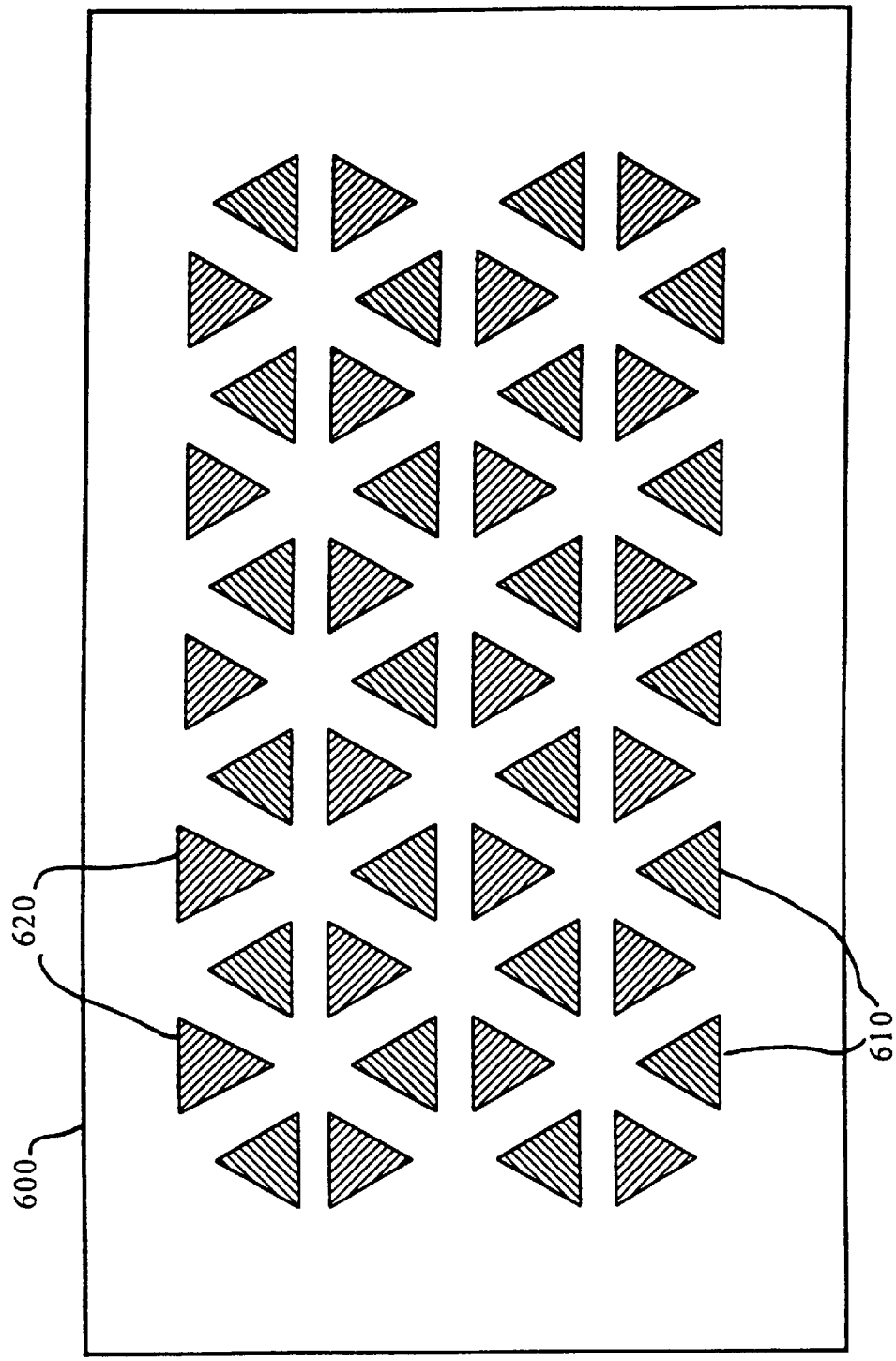
FIG. 6 shows an array of SOLEDs, similar to the SOLED of FIG. 3, on a substrate.

FIG. 6 shows a substrate 600 onto which an array of SOLEDs 610 and 620 has been deposited. Preferably, each SOLED 610 and 620 is similar to SOLED 300, and is adapted to serve as an R-G-B pixel. The voltage across each organic layer of each SOLED 610 and 620 may be independently controlled, using known technology. As a result, substrate 600, or a plurality of substrates similar to substrate 600, is adapted for use as a color display. SOLEDs 610 have a different orientation than SOLEDs 620, such that the coverage of substrate 600 by SOLEDs 610 and 620 is very high. This high coverage is preferred for display applications. The different orientation may be achieved by depositing SOLEDs 610 in accordance with the procedure described for the first embodiment, flipping or rotating the shadow mask to a new position, and then depositing SOLEDs 620 in accordance with the procedure described for the first embodiment.

RECTANGULAR GEOMETRY

Figure 7:
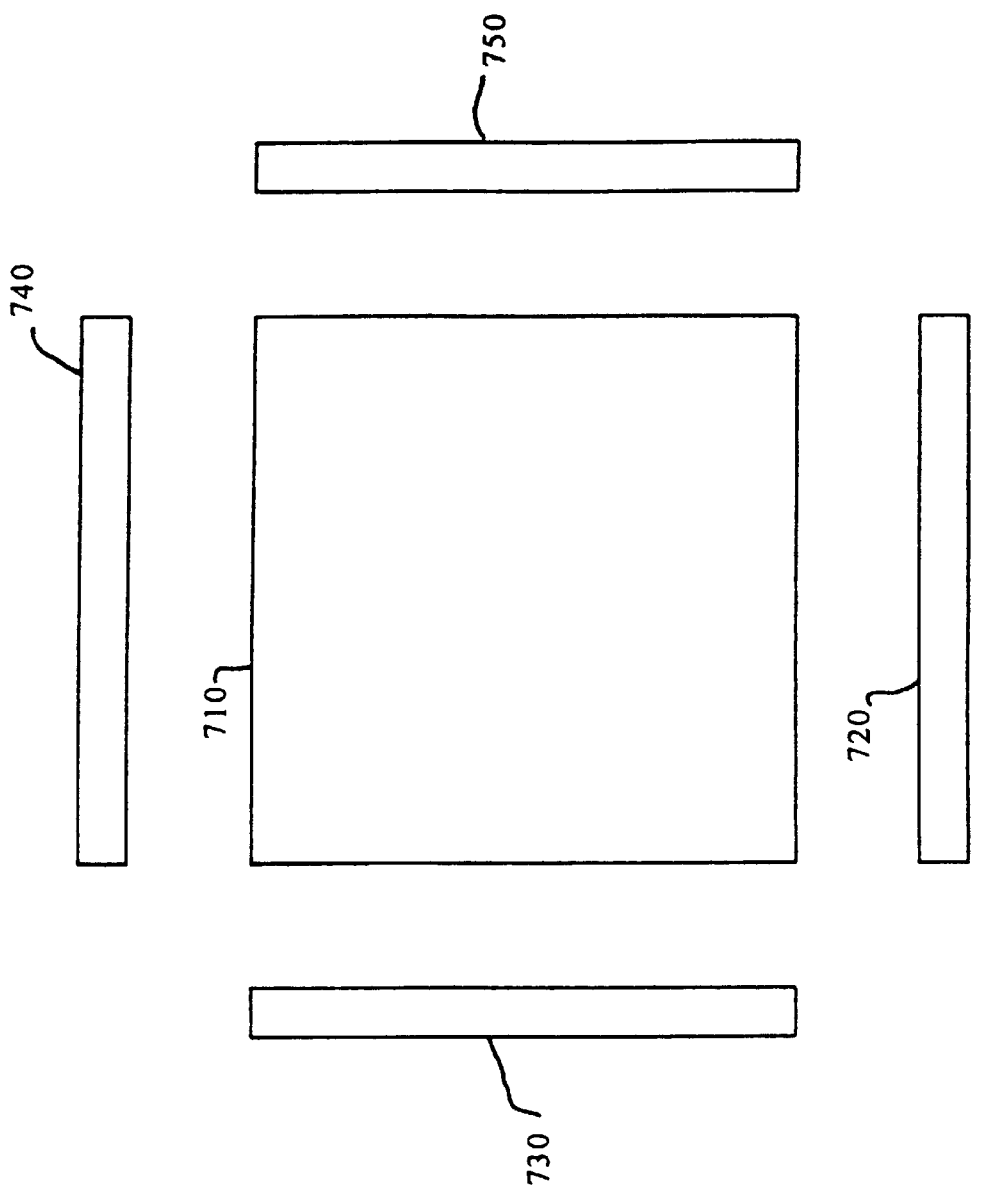
FIG. 7 shows contact pads on a substrate, adapted for use with a second embodiment of the present invention.

In a second embodiment of the invention, a shadow mask having rectangular (preferably square) apertures is used to fabricate an array of SOLEDs having a rectangular geometry. FIG. 7 shows contact pads on a substrate 700, adapted for use with such a shadow mask, over which one of the array of SOLEDs of the second embodiment may be fabricated. Substrate 700 has a central rectangular (preferably square) contact pad 710, and four periphery rectangular contact pads 720, 730, 740 and 750, where each periphery rectangular contact pad is positioned parallel to and a short distance away from a side of central contact pad 710. Substrate 700 is preferably fabricated using techniques known to the art such that each contact pad 710, 720, 730, 740 and 750 is either connected to ground, or has an independently controllable voltage. An array of pixels, each having four contact pads similar to contact pads 710, 720, 730 and 740 may be fabricated using techniques known to the art, and the voltages at the different pads of the different pixels may be controlled using any of a number of indexing techniques, such as active matrix, passive matrix, or direct addressing.

Figure 8:
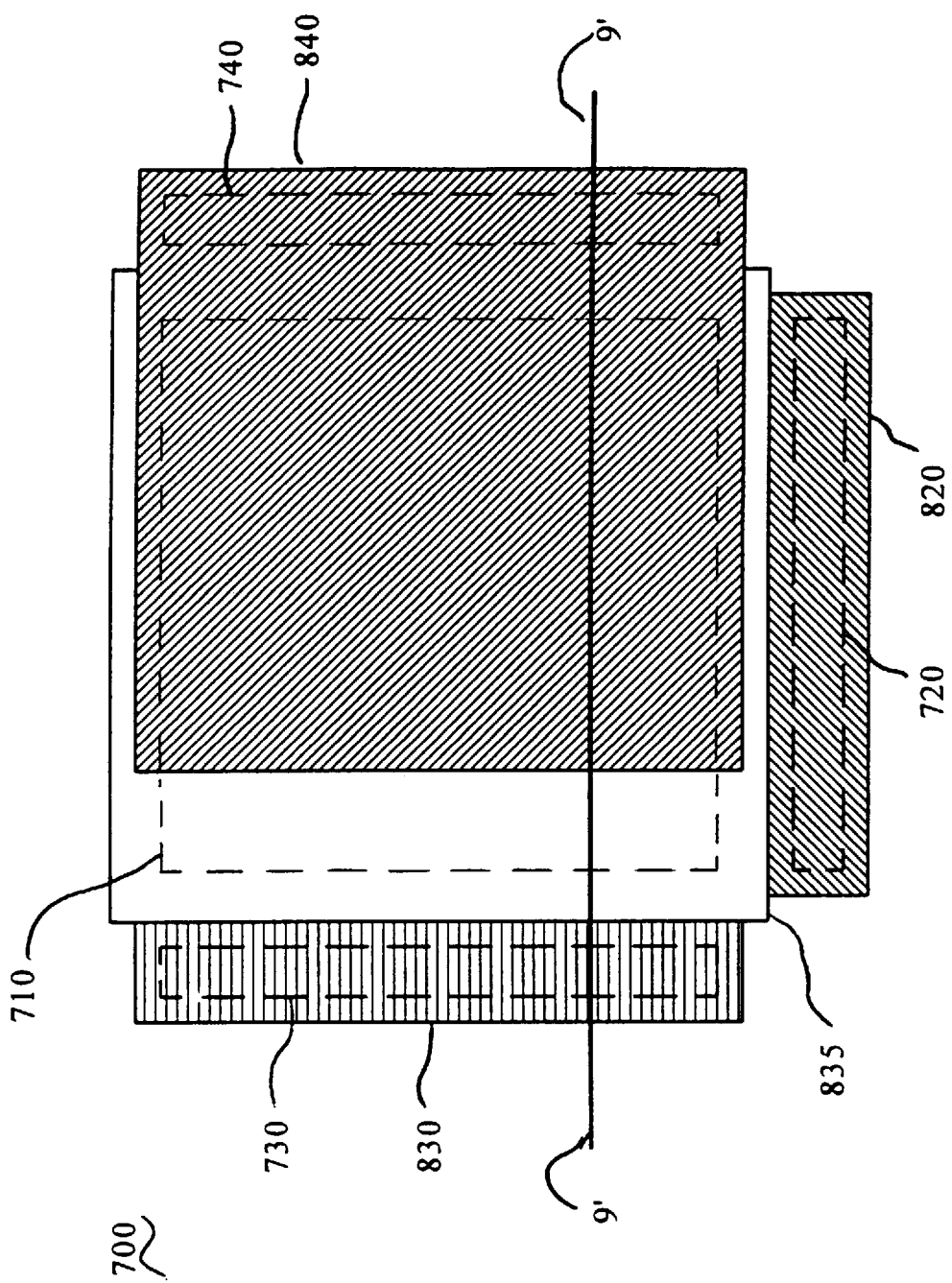
FIG. 8 shows a SOLED fabricated on top of the substrate of FIG. 7
Figure 9:
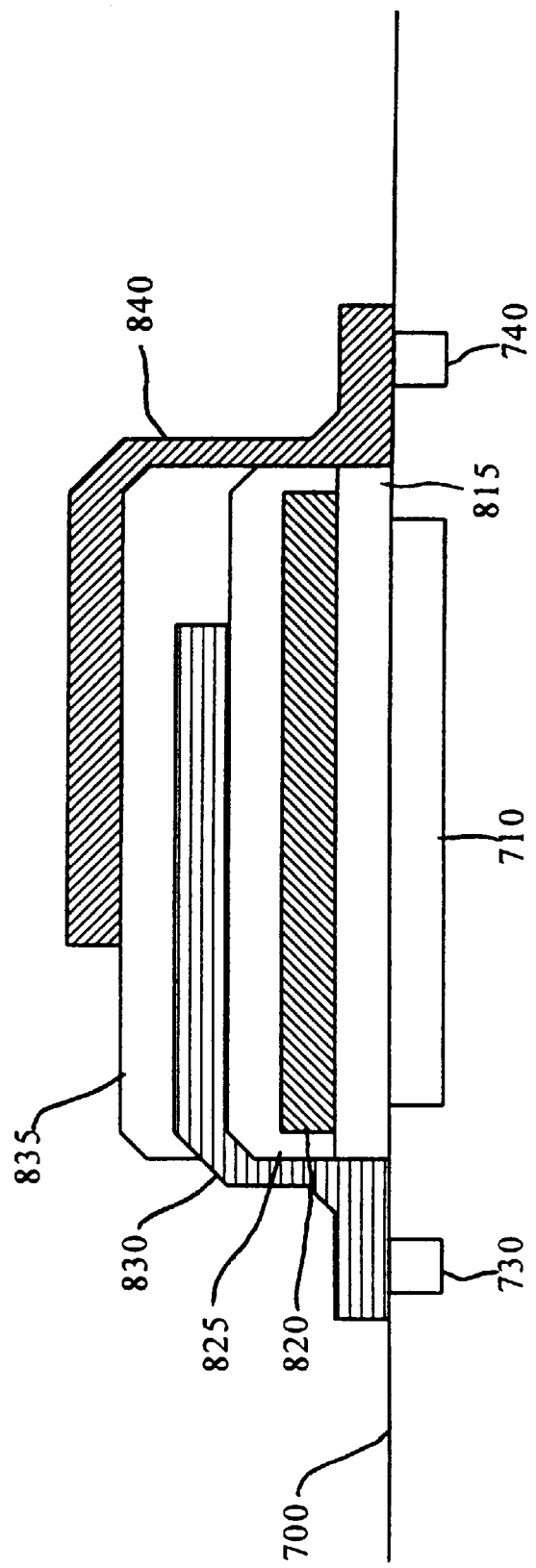
FIG. 9 shows a cross section of FIG. 8, taken through line 9' of FIG. 8.

FIG. 8 shows a SOLED 800 fabricated on top of substrate 700, and FIG. 9 shows a cross section of FIG. 8, taken through line 9' of FIG. 8. SOLED 800 is one of the array of SOLEDs of the second embodiment, where the whole array may be fabricated simultaneously by using a shadow mask having multiple apertures, one for each SOLED.

SOLED 800 includes a first organic layer 815, a first electrode 820, a second organic layer 825, a second electrode 830, a third organic layer 835, and a fourth electrode 850, sequentially deposited in that order. In FIG. 8, organic layers 815 and 825 are not shown because they have the same size and shape as organic layer 835, and are disposed underneath organic layer 835. As with the first embodiment, each electrode is in contact with one and only one contact pad, and each organic "layer" may actually include a plurality of organic layers.

SOLED 800 is adapted to emit light, preferably of three different colors, from each of first organic layer 815, second organic layer 825 and third organic layer 835. As a result, SOLED 800 may serve as an R-G-B (red-green-blue) pixel, adapted to emit a wide variety of colors of varying intensity in the visible spectrum, in a manner similar to SOLED 300 of FIG. 3.

SOLED 800 is fabricated on substrate 700, using a shadow mask having rectangular apertures, using a procedure analogous to that used to fabricate SOLED 300 on substrate 200. In particular, the SOLED of the second embodiment may be fabricated using a method similar to that used for the third embodiment, where contact pads 710, 720, 730 and 740, organic layers 815, 825, and 835, and electrodes 820, 830 and 840 are analogous to contact pads 210, 220, 230 and 240, organic layers 315, 325, and 335, and electrodes 320, 330 and 340.

Figure 10:
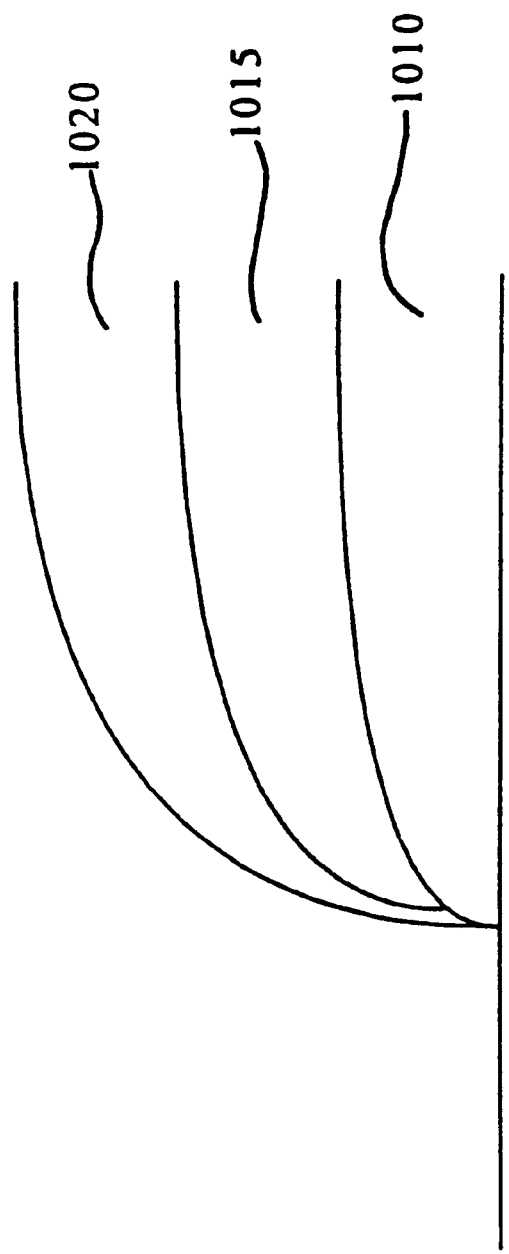
FIG. 10 shows parts of a SOLED having contact between electrodes due to spreading during deposition.

Preferably, the size of organic layers 815, 825 and 835 slightly larger than electrodes 820, 830, and 840, as shown in FIGS. 8 and 9, to reduce the possibility of edge shorting between electrodes. An edge short may occur where the organic layer used to separate electrodes just barely extends to the edge of the separated electrodes, as shown in FIG. 10. FIG. 10 shows portions of a first electrode 1010, an organic layer 1015, and a second electrode 1020, deposited in that order through the same shadow mask in the same position. Ideally, electrodes 1010 and 1020 would be completely separated by organic layer 1015, and there would be no contact between electrodes 1010 and 1020. However, if there is spreading during the deposition of the electrodes, or slight imperfections in the mask, the separated electrodes may come into contact at their edges, as shown in FIG. 10, where there is contact between electrodes 1010 and 1020. This contact may not be avoidable by moving the mask prior to the various deposition steps, such that organic layer 1015 extends further to the left than electrodes 1010 and 1020, because such movement may cause a short elsewhere.

However, such contact may be avoidable by depositing organic layers that are larger than the electrodes. These larger layers may be deposited through the same shadow mask by positioning the shadow mask further from the substrate, which leads to increased spreading, and/or moving the shadow mask during the deposition of the larger layers. Such larger layers may have a decreased thickness at the edges. A decrease in the thickness of an organic layer between two electrodes may result in an undesirable decrease in resistance and increase in current flow and brightness at the point of least thickness. As a result, it is preferable that any such decrease in thickness occurs, where possible, at points that are not between electrodes, I.e., in the part of the organic layer that extends beyond the electrodes.

MASK MOVEMENT IN ONE DIRECTION

In a third embodiment of the invention, a shadow mask having rectangular, and preferably approximately square, apertures is used to fabricate an array of SOLEDs having a rectangular geometry. In contrast to the second embodiment, the shadow mask of the third embodiment is moved in approximately the same direction each time it is moved, is in such a way that the electrodes and organic layers may be of the same size without a risk of edge shorting. For this reason, the third embodiment is preferred over the second embodiment.

Figure 11:
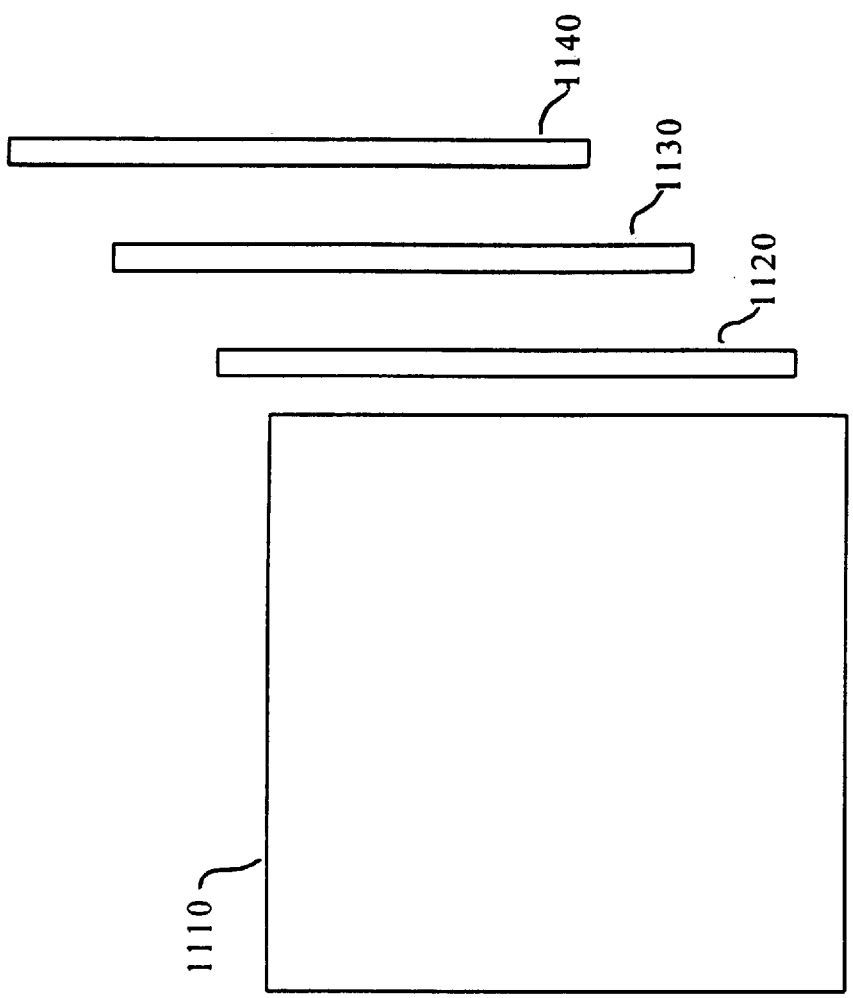
FIG. 11 shows contact pads on a substrate adapted for use with a third embodiment of the present invention.

FIG. 11 shows contact pads on a substrate 1100, adapted for use with such a shadow mask, over which one of the array of SOLEDs of the third embodiment may be fabricated. Substrate 1100 has a rectangular (preferably square) contact pad 1110, and three periphery rectangular contact pads 1120, 1130 and 1140, where the periphery contact pads are positioned parallel to each other, as well as to a side of rectangular contact pad 1110. Substrate 1100 is preferably fabricated using techniques known to the art such that each contact pad 1110, 1120, 1130 and 1140 is either connected to ground, or has an independently controllable voltage. An array of pixels, each having four contact pads similar to contact pads 1110, 1120, 1130 and 1140 may be fabricated using techniques known to the art, and the voltages at the different pads of the different pixels may be controlled using any of a number of indexing techniques, such as active matrix, passive matrix, or direct addressing.

Figure 12:
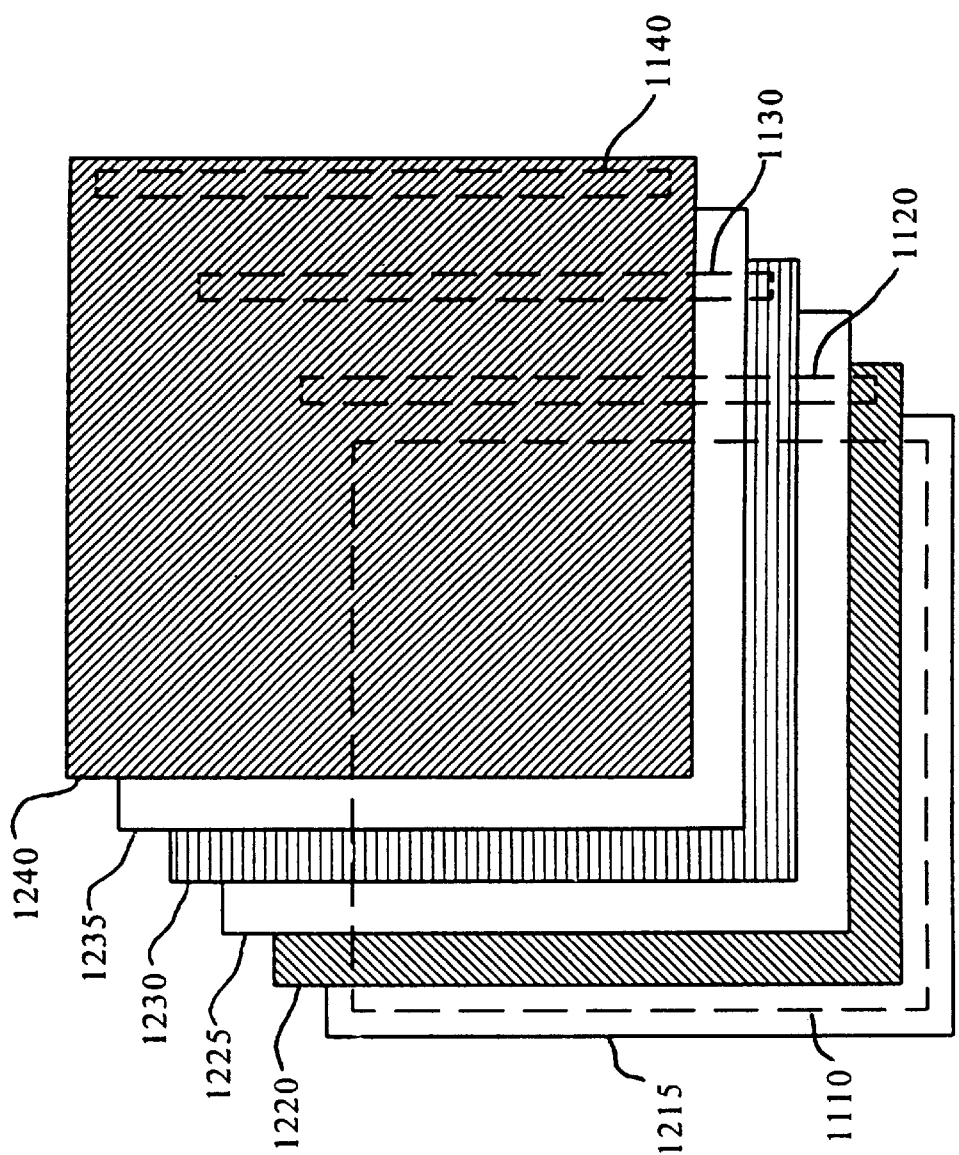
FIG. 12 shows a SOLED fabricated on top of the substrate of FIG. 11.

FIG. 12 shows a SOLED 1200 fabricated on top of substrate 1100. SOLED 1200 is one of the array of SOLEDs of the third embodiment, where the whole array may be fabricated simultaneously by using a shadow mask having multiple apertures, one for each SOLED.

SOLED 1200 includes a first organic layer 1215, a first electrode 1220, a second organic layer 1225, a second electrode 1230, an third organic layer 1235, and a third electrode 1240, sequentially deposited in that order. As with the first and second embodiments, each electrode is in contact with one and only one contact pad, and each organic "layer" may actually include a plurality of organic layers.

SOLED 1200 is adapted to emit light, preferably of three different colors, from each of first organic layer 1215, second organic layer 1225 and third organic layer 1235. As a result, SOLED 1200 may serve as an R-G-B (red-green-blue) pixel, adapted to emit a wide variety of colors of varying intensity in the visible spectrum, in a manner similar to SOLED 300 of FIG. 3.

SOLED 1200 is fabricated on substrate 1100, using a shadow mask having rectangular apertures, as follows:

Step 1: Position a shadow mask in a first position over substrate 1100, such that central contact pad 1110 is centered in the aperture. The shadow mask may be aligned with the substrate using techniques known to the art.

Step 2: Deposit organic layer 1215 through the shadow mask. The rectangular aperture is preferably sufficiently large that organic layer 1215 completely covers contact pad 1110, yet not so large that contact pads other than contact pad 1110 are covered.

Step 3: Move the shadow mask to a second position, measured relative to the first position.

Step 4: Deposit electrode 1220 through the shadow mask. The second position should be selected such that electrode 1220 contacts periphery contact pad 1120, does not contact any contact pads other than periphery contact pad 1120, and has a substantial overlap with organic layer 1215.

Step 5: Move the shadow mask to a third position, measured relative to the second position.

Step 6: Deposit organic layer 1225 through the shadow mask.

Step 7: Move the shadow mask to a fourth position, measured relative to the third position.

Step 8: Deposit electrode 330 through the shadow mask. The fourth position should be selected such that electrode 1230 contacts periphery contact pad 1130, does not contact any electrodes or contact pads other than periphery contact pad 1120, and has a substantial overlap with organic layer 1225.

Step 9: Move the shadow mask to a fifth position, measured relative to the fourth position.

Step 10: Deposit organic layer 1235 through the shadow mask.

Step 11: Move the shadow mask to a sixth position, measured relative to the fifth position.

Step 12: Deposit electrode 1240 through the shadow mask. The Fourth position should be selected such that electrode 1240 contacts periphery contact pad 1140, does not contact any electrodes or contact pads other than periphery contact pad 1140, and has a substantial overlap with organic layer 1235.

The shadow mask is moved in approximately the same direction during steps 3, 5, 7, 9 and 11. Due to the geometry of the third embodiment, the electrodes are separated from each other by organic layers, and these separating organic layers extend past the edge of at least one of the separated electrodes by a substantial margin. As a result, the risk of edge shorting is very low. For this reason, the third embodiment is preferred over the second embodiment.

The third embodiment may be adapted to a variety of shapes, such a hexagons, triangles, circles, etc. Using shapes that do not have a reflex angle ensures that there will be a direction in which the mask can be moved that will allow for the separation of electrodes by organic layers without edge shorting. Shapes having reflex angles may also be used, but care should be taken to choose an appropriate direction and magnitude of mask movement to avoid edge shorting.

PASSIVE MATRIX

In a fourth embodiment of the invention, a shadow mask having rectangular (preferably square) apertures is used to fabricate an array of SOLEDs having a rectangular geometry. The fourth embodiment is similar to the third embodiment, and demonstrates the fabrication of a passive matrix display.

Figure 13:
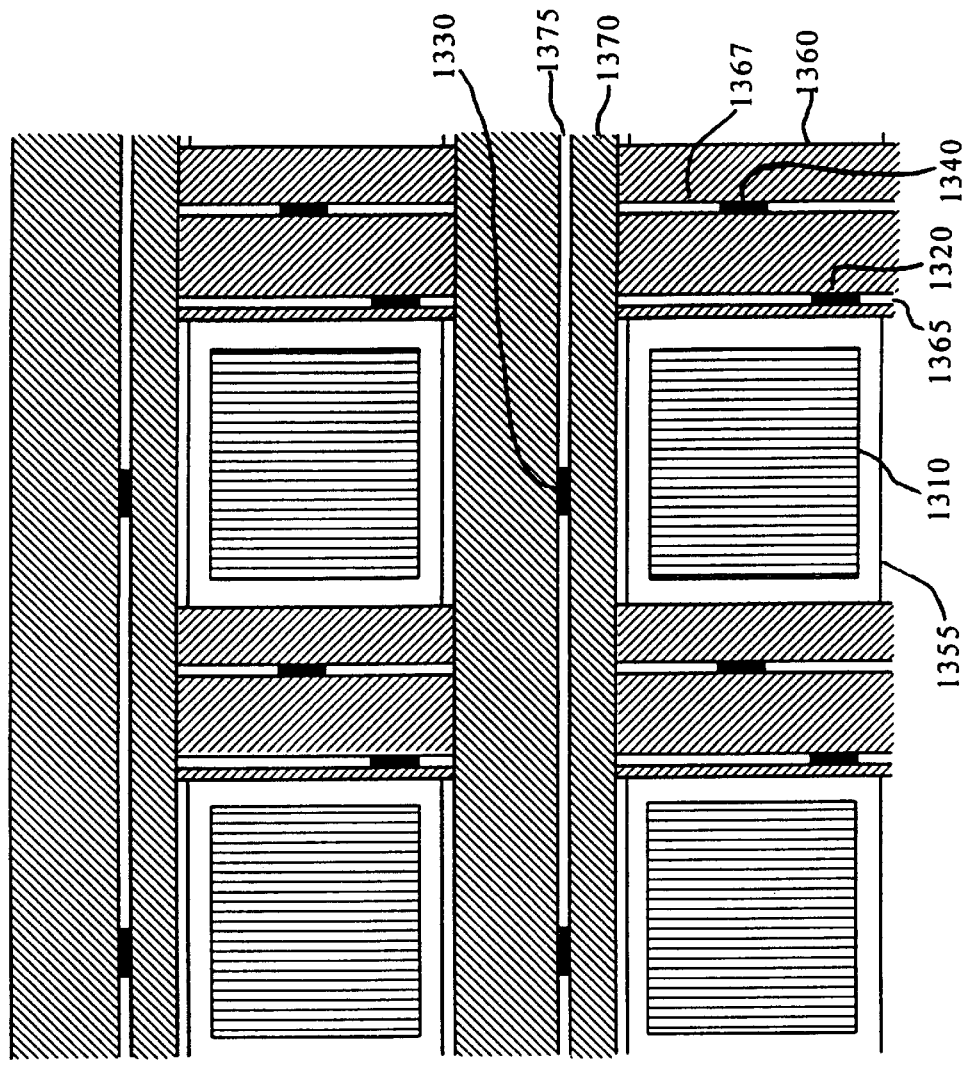
FIG. 13 shows contact pads on a substrate 1300 adapted for use with a fourth embodiment of the present invention.

FIG. 13 shows contact pads on a substrate 1300, over which a two-by-two array of pixels of the fourth embodiment may be fabricated. Each pixel on substrate 1300 has a rectangular (preferably square) contact pad 1310, and three periphery contact pads 1320, 1330 and 1340. The voltages at the contact pads of each pixel is not controllable independently of the voltages at the other pixels. However, using passive matrix techniques known the art, the emission of each layer of each SOLED fabricated on substrate 1300 may be independently controlled.

Contact pads 1310, 1320, 1330 and 1340 may be fabricated as follows:

Step 1: Deposit patterned conductive strips 1355.

Step 2: Deposit patterned insulating strips 1360, perpendicular to and partially covering conductive strips 1355.

Step 3: Deposit patterned conductive strips 1365 and 1367 on top of insulating strips 1360.

Step 4: Deposit patterned insulating strips 1370 over the results of step 3, perpendicular to and partially covering insulating strips 1360 and conductive strips 1365 and 1367.

Step 5: Deposit patterned conductive strips 1375 on top of insulating strips 1370.

Step 6: Deposit a passivating layer (not shown in FIG. 13 for clarity) over the result of step 5.

Step 7: Etch windows in the passivating layer for contact pads 1310, 1320, 1330 and 1340. In particular, the window for contact pad 1310 should expose a part of conductive strip 1355, the window for contact pad 1320 should expose conductive strip 1365, the window for contact pad 1330 should expose conductive strip 1375, and the window for contact pad 1340 should expose conductive strip 1367.

Conductive strips 1355, 1365, 1367 and 1375 are made of a conductive material, such as gold, copper, aluminum, or similar materials. Insulating strips 1360 and 1370 and the passivating layer are made of a non-conducting material, such as polyimide or $SiN_x$.

Figure 14:
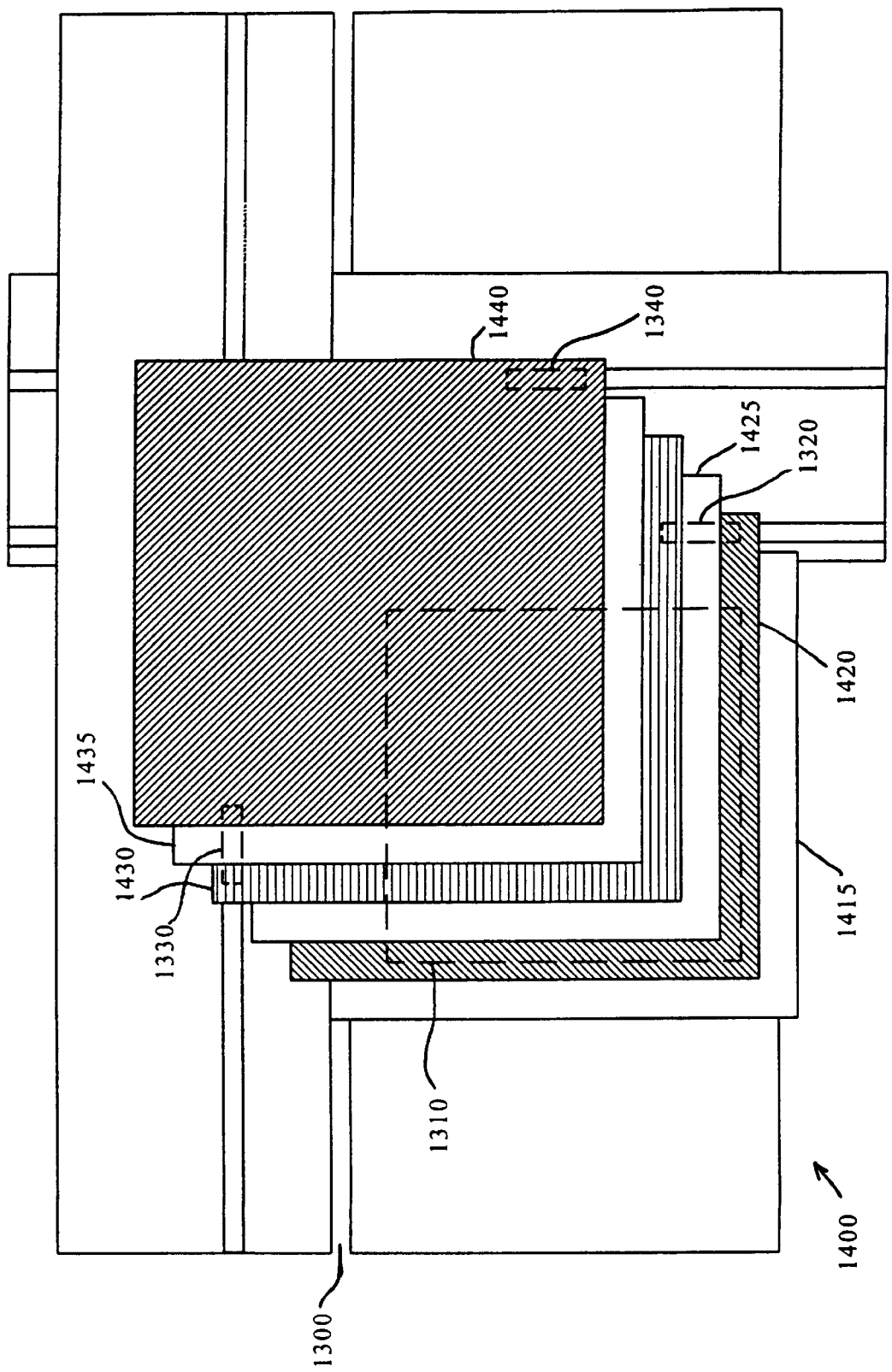
FIG. 14 shows a SOLED fabricated on top of the substrate of FIG. 13.

FIG. 14 shows a SOLED 1400 fabricated on top of substrate 1300. SOLED 1400 is one of the array of SOLEDs of the fourth embodiment, where the whole array may be fabricated simultaneously by using a shadow mask having multiple apertures, one for each SOLED.

SOLED 1400 includes a first organic layer 1415, a first electrode 1420, a second organic layer 1425, a second electrode 1430, an third organic layer 1435, and a third electrode 1440, sequentially deposited in that order. As with the third embodiment, each electrode is in contact with one and only one contact pad, and each organic "layer" may actually include a plurality of organic layers.

SOLED 1400 is adapted to emit light, preferably of three different colors, from each of first organic layer 1415, second organic layer 1425 and third organic layer 1435. As a result, SOLED 1400 may serve as an R-G-B (red-green-blue) pixel, adapted to emit a wide variety of colors of varying intensity in the visible spectrum, in a manner similar to SOLED 300 of FIG. 3.

SOLED 1400 is fabricated on substrate 1300, using a shadow mask having rectangular apertures, using a procedure analogous to that used to fabricate SOLED 1200 on substrate 1100. In particular, the SOLED of the fourth embodiment may be fabricated using a method similar to that used for the third embodiment, where contact pads 1310, 1320, 1330 and 1340, organic layers 1415, 1425, and 1435, and electrodes 1420, 1430 and 1440 are analogous to contact pads 1110, 1120, 1130 and 1140, organic layers 1215, 1225, and 1235, and electrodes 1220, 1230 and 1240.

As with the third embodiment, the electrode of the fourth embodiment are separated from each other by organic layers, and these separating organic layers extend past the edge of at least one of the separated electrodes by a substantial margin. As a result, the risk of edge shorting is very low. The fourth embodiment may be adapted to a variety of shapes, such as hexagons, triangles, circles, etc.

STANDOFF

A standoff layer may be deposited on a substrate prior to the fabrication of a device in order to facilitate the vertical positioning of the shadow mask. Such a standoff is preferably made of an insulating material, such as $SiO_2$ or $SiN_x$, and may be deposited and patterned using techniques known to the art. During the fabrication of the SOLED, the vertical position of the shadow mask may then be determined by contact with the standoff. A standoff on a frame used to hold the substrate may also be used.

When a standoff is used, reference may be made to the substrate during movement, or the lack thereof, in a direction normal to the substrate, because the distance between the mask and the substrate is determined by contact with the standoff, which is a feature on the substrate. However, even when position in a direction normal to the substrate is determined by reference to the standoff, a second position may still be measured relative to a first position for purposes of movement parallel to the substrate, provided that reference is not made to a feature on the substrate to determine the extent of such parallel movement. In addition, movement in a direction normal to the substrate may be from a first position determined with reference to the substrate, i.e., contact with the standoff, to a second position measured relative to the first position, i.e., raise the mask off of the standoff by a desired distance. Such movement in a direction normal to the substrate may be desirable, for example, to vary the size of the layer deposited through the shadow mask, as described with respect to the second embodiment.

A standoff may also be used to make the vertical distance between the mask and the substrate dependent upon the horizontal position of the mask. For example, small pyramids or other structures having non-horizontal planes may be fabricated on the mask and the substrate, such that the points of contact between the mask and substrate occur at these structures. When the mask is moved in a horizontal direction, the mask also moves in a vertical direction due to the contact at the non-horizontal planes.

Figure 15:
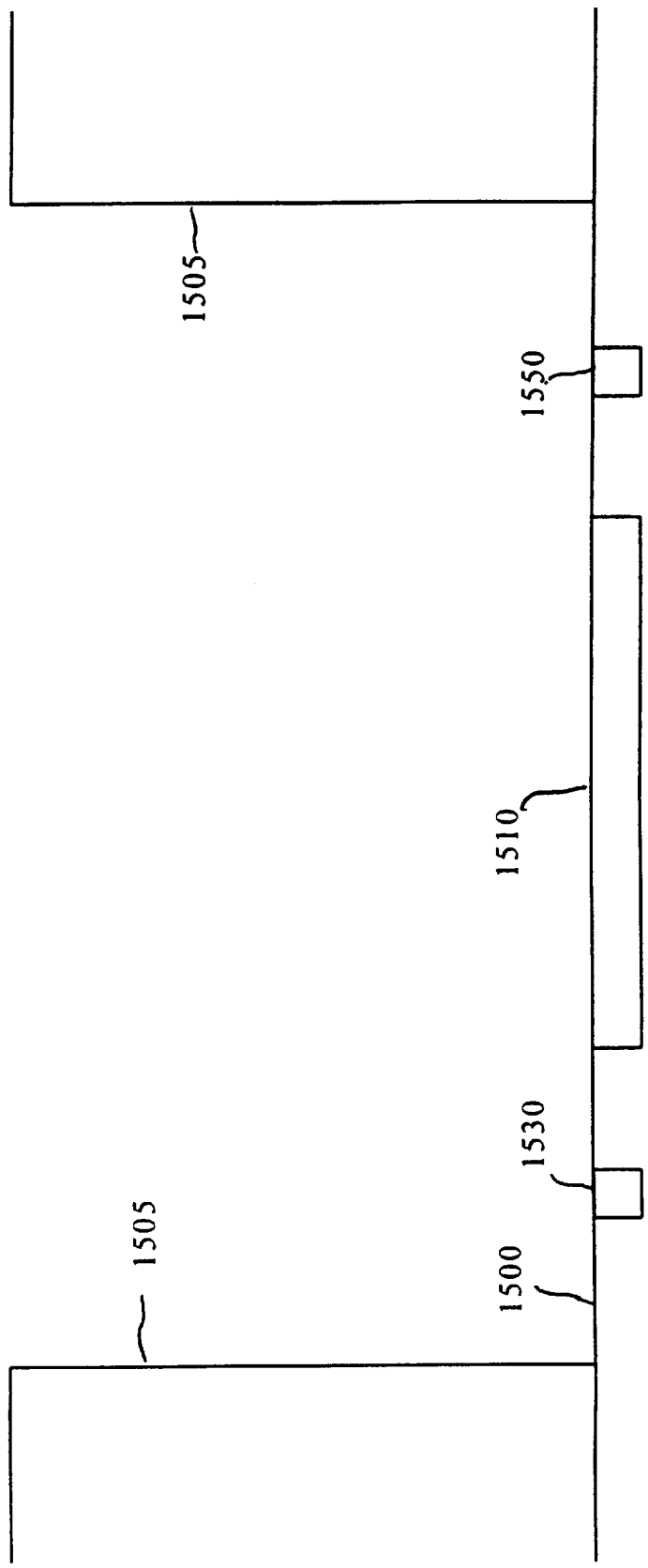
FIG. 15 shows a substrate having a standoff.

FIG. 15 shows a substrate 1500 having a standoff 1505. With reference to the second embodiment, for example, contact pads 1510, 1530 and 1550 are analogous to contact pads 710, 730 and 750, respectively, of FIGS. 7 and 8. A SOLED similar to SOLED 800 of FIG. 8 may be fabricated on substrate 1500, using a procedure similar to that used to fabricate SOLED 800. However, the vertical position of the shadow mask may be determined by contact with standoff 1505. Preferably, the area of the substrate and other features, such as contact pads, exposed by the patterning of the standoff is larger than the apertures in the shadow mask. Preferably, this exposed area is larger than the apertures by a margin sufficiently large that material deposited through the shadow mask is not deposited onto the standoff, allowing for movement of the shadow mask during fabrication.

A lubricant may be used between the shadow mask and the standoff, to facilitate movement of the shadow mask in a direction parallel to the substrate. The lubricant will be present in vacuum while the device is being fabricated. It is therefore preferable that the lubricant does not easily disperse into a vacuum, and/or that the lubricant may be present as an impurity in the fabricated device without having an adverse affect on the device.

Figure 16:
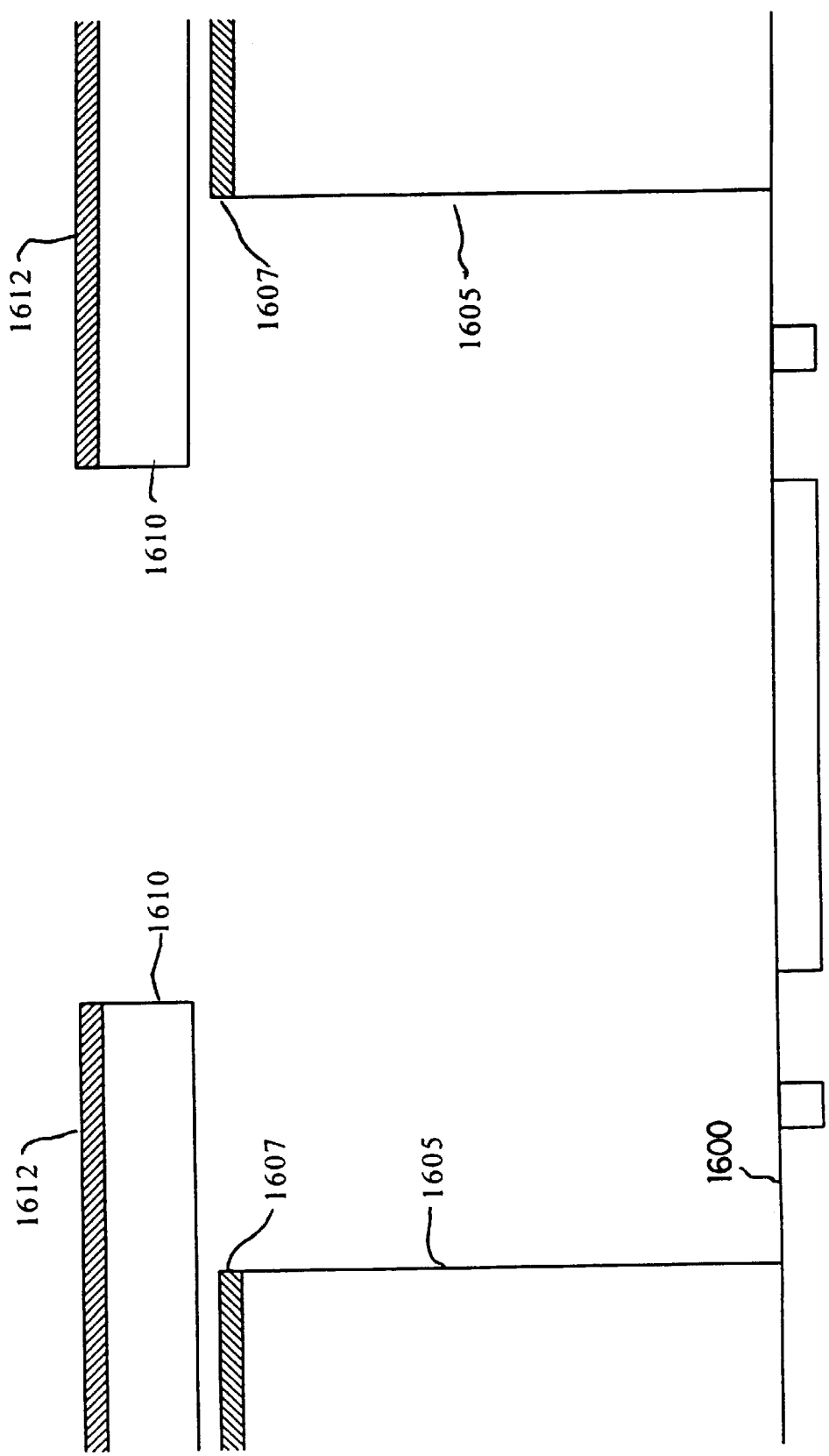
FIG. 16 shows a substrate having a standoff and a mask adapted for use with electrical charges applied to the mask and substrate.

An electrical charge may be used to facilitate movement of the shadow mask and/or to secure the shadow mask in position during a process step such as deposition through the shadow mask. FIG. 16 shows a substrate 1600 similar to substrate 1500, but having a standoff 1605 with a conductive layer 1607. Standoff 1605 with conductive layer 1607 is adapted for use with a mask 1610 having a conductive layer 1612. Conductive layers 1607 and 1612 are connected to charge sources such that an electrical charge may be applied to each conductive layer. In order to secure mask 1610 in position, charges having opposite polarities may be applied to conductive layers 1607 and 1612, respectively. Conductive layer 1607 will then attract conductive layer 1612, securing the mask in position. In order to facilitate the movement of mask 1610, charges having the same polarities may be applied to conductive layers 1607 and 1612. Conductive layer 1607 will then repel conductive layer 1612, facilitating the movement of mask 1610. Electrical charges may be used in conjunction with a lubricant. Mask 1610 is shown slightly above standoff 1605, to more clearly illustrate that conductive layer 1607 is attached to standoff 1605 and not to mask 1610. Mask 1610 may be lowered slightly to place it in contact with standoff 1605.

ETCHING

The present invention is not limited to deposition through a shadow mask. For example, etching may also be performed through a shadow mask. In a fifth embodiment of the invention, a device is fabricated by positioning a mask in a first position over a substrate onto which materials have already been deposited. The materials are then etched through the shadow mask, using an etching process such as reactive ion etching or plasma etching. After the etching has been completed, the mask is moved to a second position over the substrate, measured relative to the first position. The materials are then etched a second time through the shadow mask. The fifth embodiment is useful, for example, in situations where two areas to be etched have similar size and shape, but the length of time and hence the depth of the etching is different in the two areas.

MASK STIFFNESS

The present invention is advantageous in that it facilitates the simultaneous fabrication of a large array of devices. However, very large masks may be used for such simultaneous fabrication. Depending on the size of the mask, and on whether a standoff is used, it may be preferable to include reinforcing ribs on the mask to increase mask stiffness. Also, where the mask has large apertures, it may be preferable to provide small bridges across the large apertures to increase mask stiffness. If such bridges are provided, the mask may be moved along the direction of the aperture during a process step to ensure that the bridge does not mask the substrate from the process step.

A smaller number of periphery contact pads and electrodes may be used with either the triangular or rectangular geometry to fabricate a SOLED having fewer emissive layers, or to fabricate an OLED having one emissive layer. Also, geometries other than triangular and rectangular may be used, although triangular and rectangular geometries are preferred because, properly utilized, they maximize the "fill factor," i.e., the coverage of the substrate by devices.

Note that the Figures used to illustrate the various embodiments may not be drawn to scale, in order to more clearly illustrate the principles of the present invention. For example, the fill factor attainable with the present invention is much higher than shown in the Figures, because features such as the movement of the mask and the size of insulating strips 1360 and 1370, for example, have been exaggerated to more clearly illustrate the principles of the invention.

A larger number of electrodes may also be used. For example, a three-color SOLED having five electrodes, i.e., four electrodes plus one contact pad that directly contacts an organic layer, may be fabricated. This larger number of electrodes allows the use of an insulating layer, which may greatly simplify the driving circuit used to control voltages, as described in Burrows et al., "Stacked Organic Light Emitting Devices," patent application Ser. No. 08/792,046, filed on Feb. 3, 1997, which is incorporated by reference. A larger number of contact pads may be used to accommodate the larger number of electrodes, or, where two grounded electrodes are desired, the second grounded electrode may be deposited so as to contact the first grounded electrode.

The dimensions of the devices that may be fabricated using the present invention is limited only by the accuracy with which the movement of the shadow mask may be controlled, the size of features that may be deposited through the shadow mask, and inherent requirements of the devices themselves—for example, each device will draw a certain amount of current, and the lines in the substrate should be sufficiently large to accommodate the current draw by the devices to which it is connected.

The inventors' calculations show, for example, that a 10 inch passive matrix display having a pixel size of 200 square microns and 20 micron wide, 5000 Å thick bus lines, with the fill factor limited only by the space required for the bus lines, is well within the capabilities of the present invention using currently available deposition and positioning technologies. As advances are made in these technologies, it is contemplated that the present invention can be used to fabricate smaller pixels. Also, multiple arrays of devices may be positioned side-by-side to create an even larger array.

EXAMPLES

A three-by-three array of three-color SOLEDs was fabricated in accordance with the first embodiment, and is described with respect to the reference numbers of FIGS. 2 and 3, and the steps described for the first embodiment. Triangular contact pad 210 had sides 2 mm in length. Periphery contact pads 220, 230 and 240 were positioned 400 microns away from the sides of contact pad 210, and were approximately rectangular in shape. The shadow mask was 50 microns thick, and was obtained from Photo Sciences, Inc. of Torrance, Calif. The shadow mask had a triangular aperture with sides 2.7 mm in length, such that the horizontal distance between the sides of the aperture and the sides of triangular contact pad 210 is about 200 microns when triangular contact pad 210 is centered in the aperture.

Figure 17:
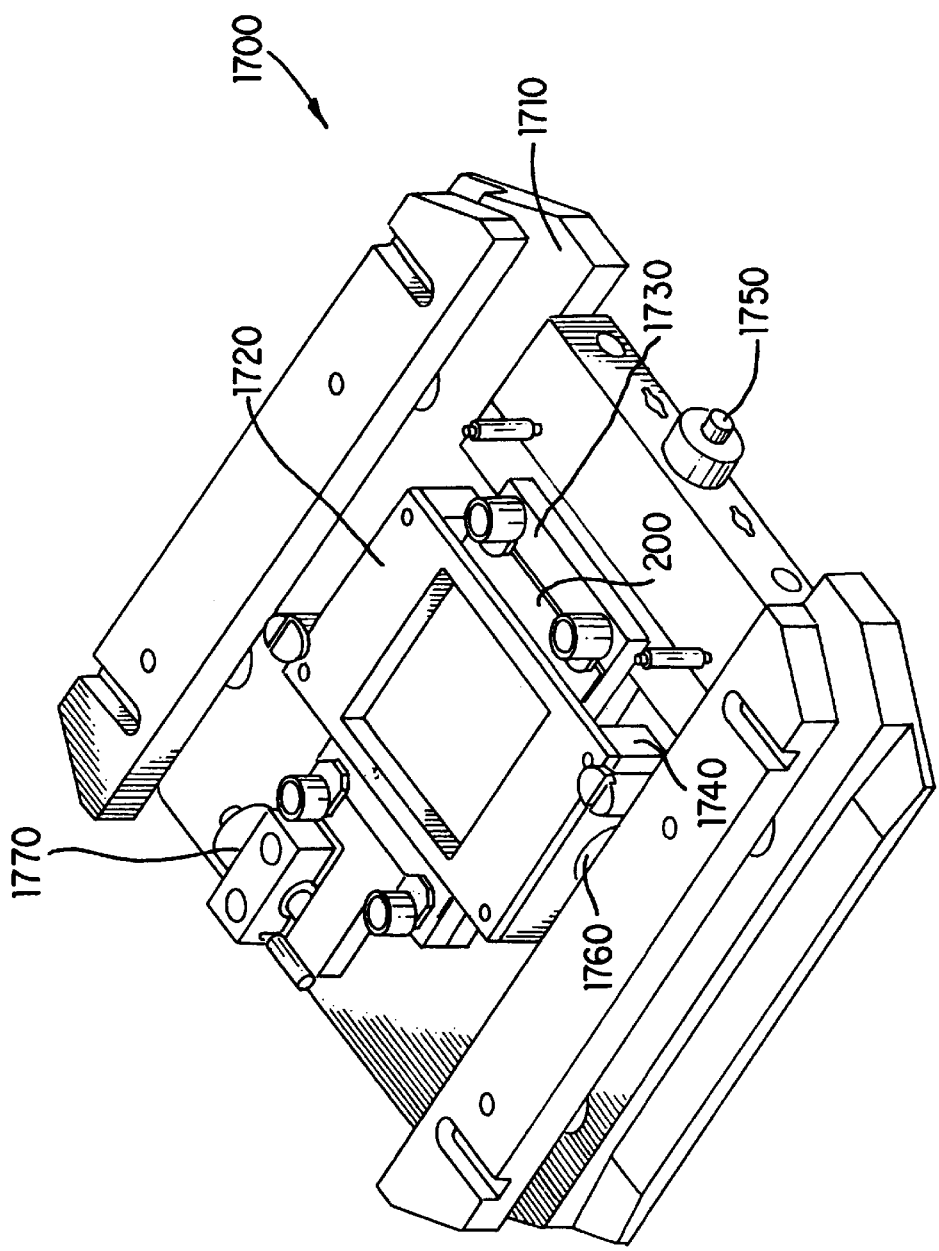
FIG. 17 shows a precision movement frame.

FIG. 17 shows a precision movement frame 1700 that was used to fabricate the three color SOLED. The shadow mask was held in place by a mask frame 1720, which is immovably attached to support frame 1710. Substrate 200 was held in place by a stage 1730. Stage 1730 was moveable relative to support frame 1710 and mask frame 1720. The separation between the shadow mask and substrate 200 is determined by the size of a stand 1740. In particular, that separation was approximately 12–25 nm. High vacuum compatible lubricant Microcote 296, available from Castrol Industrial North America Inc. of Downers Grove, Ill., was used in precision movement frame 1700 to facilitate movement.

Movement in the X-direction was controllable by tuning X-axis screw 1750. Movement in the Y-direction was controllable by turning Y-axis screw 1760. Rotation in the X-Y plane was controllable by turning rotation control screw 1770. Because X-axis screw 1750 and Y-axis screw 1760 are attached to stage 1730, the rotation of stage 1730 also rotated the orientation of the X and Y axes. X-axis screw 1750, Y-axis screw 1760 and rotation control screw 1770 were AJS8-02H high precision screws, available from the Newport Corp. of Irvine, Calif. Stage 1730 could be moved relative to mask frame 1720 up to 0.25 inches in the X and Y direction, and up to 8 degrees in rotation, and the movement was controllable with a precision of about 12 microns.

The SOLED was fabricated following the procedure described with respect to the first embodiment. Movement of substrate 200 relative to the shadow mask was performed in a glove box under $N_2$ atmosphere by manually turning X-axis screw 1750, Y-axis screw 1760 and rotation control screw 1770. The initial alignment of the shadow mask and substrate (step 1 of the method of the first embodiment) was performed with the use of a charged coupled devices (CCD) camera system, which was used to view the substrate and triangular contact pad 210 through the aperture in the shadow mask to determine when triangular contact pad 210 was centered in the aperture. Subsequent movements of substrate 200 relative to the shadow mask (steps 3, 5, 7, 9 and 11 of the method of the first embodiment) were also performed in the glove box, but relied on turning X-axis screw 1750 and/or Y-axis screw 1760 by a calculated amount, without relying on the camera system. In particular, the substrate was moved about 400 microns during each of these subsequent movement steps. During the deposition of organic layers, contact pad 210 was approximately centered in the triangular aperture. During the deposition of electrode layers, the point of contact pad 210 opposite the contact pad that the electrode contacts was approximately aligned with the corresponding point of the triangular aperture.

Substrate 200 was glass. Contact pads 210, 220, 230 and 240 were made of ITO, patterned from a sheet of ITO pre-coated on substrate 200. Lines running to each contact pad were also patterned, and the line running to contact pad 210 was covered with an insulating material to prevent shorts. The lines were designed to be individually connected to voltage sources, and were not a part of an active or passive matrix.

First organic layer 315, deposited during step 2, was actually two layers: first, a 500 Å layer of 4,4'-bis biphenyl (α-NPD) was deposited, followed by a 500 Å layer of aluminum tris(8-hydroxyquinolate) ($Alq_3$). First organic layer 315 was designed to emit green light in response to an applied voltage. First electrode 320, deposited during step 4, was also two layers: first, a 100 Å layer of Mg:Ag alloy was deposited, followed by a 550 Å layer of indium tin oxide (ITO). Second organic layer 325, deposited during step 6, was actually four layers: first, a 50 Å layer of CuPc was deposited, followed by a 500 Å layer of α-NPD, followed by a 450 Å layer of bis-(8-hydroxy) quinaldine aluminum phenoxide ($Alq'_2OPh$), followed by a 150 layer of $Alq_3$. Second organic layer 325 was designed to emit blue light in response to an applied voltage. Second electrode 330, deposited during step 8, was two layers: first, a 100 Å layer of Mg:Ag alloy was deposited, followed by a 530 Å layer of ITO. Third organic layer 335, deposited during step 10, was actually four layers: first, a 50 Å layer of copper phthalocyanine (CuPc) was deposited, followed by a 500 Å layer of α-NPD, followed by a 400 Å layer of $Alq_3$ doped with 2,3,7,8,12,13,17,18-octaethyl-21H, 23H-porphine platinum (PtOEP), followed by a 150 Å layer of $Alq_3$. Third organic layer 335 was designed to emit red light in response to an applied voltage. Third electrode 340, deposited during step 12, was two layers: first, a 100 Å layer of Mg:Ag alloy was deposited, followed by a 417 Å layer of ITO. The ITO was deposited by RF-magnetron sputtering, and all other materials were deposited by thermal evaporation. Precision movement frame 1700, and the attached shadow mask and substrate 200, were moved to the glove box for all steps involving movement of substrate 200 relative to the shadow mask, i.e., steps 1, 3, 5, 7, 9 and 11, and were moved to a vacuum chamber for all steps involving deposition, i.e., steps 2, 4, 6, 8, 10 and 12.

Figure 18:
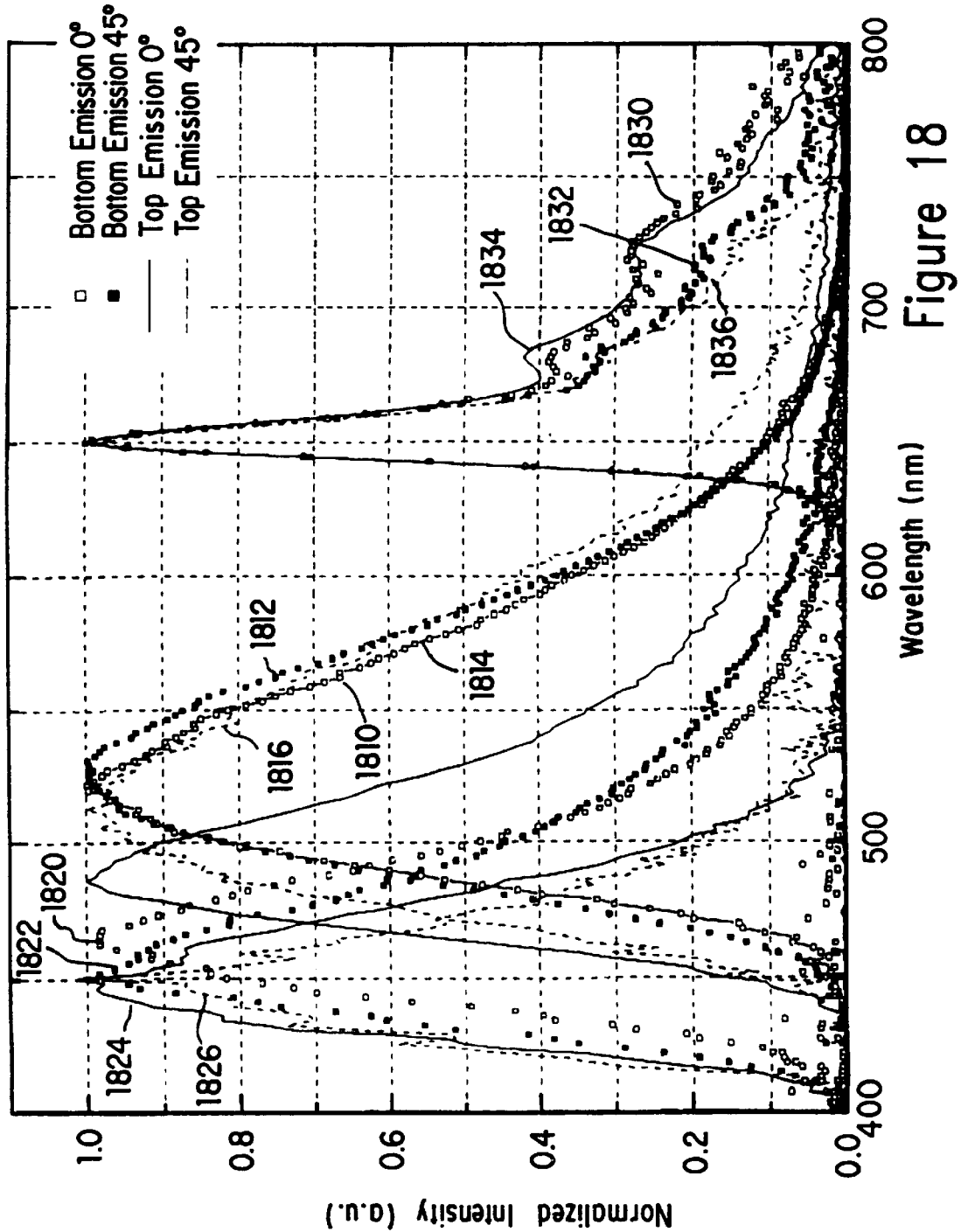
FIG. 18 shows emission spectra from a fabricated SOLED.

FIG. 18 shows emission spectra from the organic layers 315, 325 and 335 of the fabricated SOLED, from the top (through electrode 340) and bottom (through substrate 200) of the device, from a direction normal to the plane of the SOLED, and from a direction 45 degrees off-normal. Plots 1810, 1812, 1814 and 1816 show the emission spectra of organic layer 315 from the bottom normal, bottom off-normal, top normal, and top off-normal directions, respectively. Plots 1820, 1822, 1824 and 1826 show the emission spectra of organic layer 325 from the bottom normal, bottom off-normal, top normal, and top off-normal directions, respectively. Plots 1830, 1832, 1834 and 1836 show the emission spectra of organic layer 335 from the bottom normal, bottom off-normal, top normal, and top off-normal directions, respectively. The observed shifts in the spectra as measured from different directions are due to microcavity effects.

Figure 19:
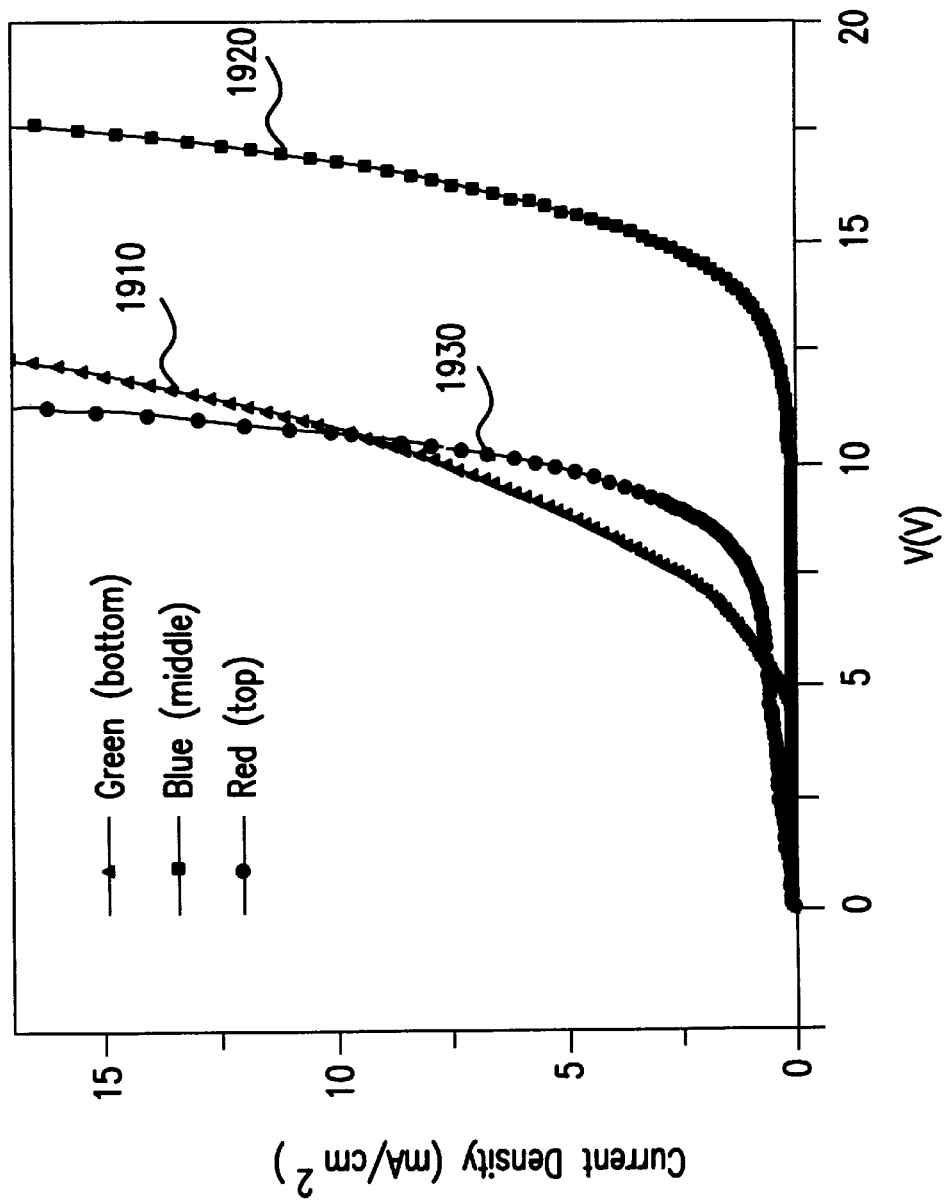
FIG. 19 shows current-voltage (I-V) plots for a fabricated SOLED.

FIG. 19 shows current-voltage (I-V) plots for the SOLED. Plots 1910, 1920 and 1930 show I-V plots for organic layers 315, 325 and 335, respectively. The quantum efficiency at 10 $mA/cm^2$ were 0.6%, 0.3% and 0.1% for bottom emissions, and 0.4%, 0.1%, and 0.4% for top emissions, for organic layers 315, 325 and 335, respectively.

Devices fabricated in accordance with the present invention may be incorporated into a wide variety of products. An array of SOLEDs fabricated in accordance with the present invention may form a display. Such a display may be incorporated into other products, such as a vehicle, a television, a computer, a printer, a screen, a sign, a telecommunications product or a telephone, in a manner known to one of skill in the art. SOLEDs fabricated in accordance with the present invention may also be used for applications other than displays. For example, a line of such SOLEDs could be incorporated into a printer, and used to generate images, in a manner known to one of skill in the art.

The present invention may also be used to fabricate a wide variety of devices in addition to OLEDs and SOLEDs. For example, an array of stacked solar cells may be fabricated using embodiments of the present invention similar to those described for SOLEDs. Such an array advantageously has a high fill factor, and the stacked solar cells advantageously increase the amount of energy produced per unit area, relative to a single layer of solar cells.

While the present invention is described with respect to particular examples and preferred embodiments, it is understood that the present invention is not limited to these examples and embodiments. In particular, the present invention is not limited to SOLEDs, and may be applied to a wide variety of electronic devices. In addition, with respect to SOLEDs, the present invention is not limited to the particular examples and embodiments described. The present invention as claimed therefore includes variations from the particular examples and preferred embodiments described herein, as will be apparent to one of skill in the art.

What is claimed is:

1. A method of fabricating a device, comprising the steps of:
   (a) fabricating a standoff on a substrate;
   (b) positioning a shadow mask in a first position over the substrate by placing the shadow mask onto the standoff;
   (c) performing a first process on the substrate through the shadow mask;
   (d) after performing the first process, moving the shadow mask to a second position over the substrate, wherein the second position is measured relative to the first position; and
   (e) after moving the shadow mask to a second position, performing a second process on the substrate through the shadow mask; wherein a first charge is applied to the standoff and a second charge having a polarity opposite to that of the first charge is applied to the shadow mask, during a step selected from the group consisting of step (c) and step (e), to facilitate intimate contact between the standoff and the shadow mask during the selected step.

2. A method of fabricating a device, comprising the steps of:
   (a) fabricating a standoff on a substrate;
   (b) positioning a shadow mask in a first position over the substrate by placing the shadow mask onto the standoff;
   (c) performing a first process on the substrate through the shadow mask;
   (d) after performing the first process, moving the shadow mask to a second position over the substrate, wherein the second position is measured relative to the first position; and
   (e) after moving the shadow mask to a second position, performing a second process on the substrate through the shadow mask; wherein a first charge is applied to the standoff and a second charge having a polarity the same as that of the first charge is applied to the shadow mask, during step (d), to facilitate the moving of the shadow mask.

3. A method of fabricating a device, comprising the steps of:
   (a) fabricating a standoff on a substrate;
   (b) positioning a shadow mask in a first position over the substrate by placing the shadow mask onto the standoff;
   (c) performing a first process on the substrate through the shadow mask;
   (d) after performing the first process, moving the shadow mask to a second position over the substrate, wherein the second position is measured relative to the first position; and
   (e) after moving the shadow mask to a second position, performing a second process on the substrate through the shadow mask; wherein a lubrication layer is applied between the standoff and the shadow mask.

4. The method of claim 1, herein the first and second processes are deposition processes.

5. The method of claim 4, wherein material deposited during step (e) at least partially covers material deposited during step (c).

6. The method of claim 1, wherein the first and second processes are etching processes.

7. The method of claim 1, wherein the first position is measured relative to features on the substrate.

8. The method of claim 1, wherein the second position is displaced from the first position in a direction approximately parallel to the substrate.

9. The method of claim 8, wherein the second position is also displaced from the first position in a direction approximately perpendicular to the substrate.

10. The method of claim 1, wherein x-y translator motors are used to move the shadow mask during step (d).

11. The method of claim 1, wherein piezo electric materials are used to move the shadow mask during step (d).

12. The method of claim 1, wherein the device fabricated is a stacked organic light emitting device.

13. The method of claim 1, wherein the device fabricated is a stacked solar cell.

14. The method of claim 12, wherein the device fabricated is incorporated into a display.

15. The method of claim 14, wherein the display is incorporated into a product selected from the group consisting of: a vehicle, a television, a computer, a printer, a screen, a sign, a telecommunications product and a telephone.

16. The method of claim 12, wherein the device fabricated is incorporated into a printer.

17. The method of claim 2, herein the first and second processes are deposition processes.

18. The method of claim 17, wherein material deposited during step (e) at least partially covers material deposited during step (c).

19. The method of claim 2, wherein the first and second processes are etching processes.

20. The method of claim 2, wherein the first position is measured relative to features on the substrate.

21. The method of claim 2, wherein the second position is displaced from the first position in a direction approximately parallel to the substrate.

22. The method of claim 21, wherein the second position is also displaced from the first position in a direction approximately perpendicular to the substrate.

23. The method of claim 2, wherein x-y translator motors are used to move the shadow mask during step (d).

24. The method of claim 2, wherein piezo electric materials are used to move the shadow mask during step (d).

25. The method of claim 2, wherein the device fabricated is a stacked organic light emitting device.

26. The method of claim 2, wherein the device fabricated is a stacked solar cell.

27. The method of claim 25, wherein the device fabricated is incorporated into a display.

28. The method of claim 27, wherein the display is incorporated into a product selected from the group consisting of: a vehicle, a television, a computer, a printer, a screen, a sign, a telecommunications product and a telephone.

29. The method of claim 25, wherein the device fabricated is incorporated into a printer.

30. The method of claim 3, herein the first and second processes are deposition processes.

31. The method of claim 30, wherein material deposited during step (e) at least partially covers material deposited during step (c).

32. The method of claim 3, wherein the first and second processes are etching processes.

33. The method of claim 3, wherein the first position is measured relative to features on the substrate.

34. The method of claim 3, wherein the second position is displaced from the first position in a direction approximately parallel to the substrate.

35. The method of claim 34, wherein the second position is also displaced from the first position in a direction approximately perpendicular to the substrate.

36. The method of claim 3, wherein x-y translator motors are used to move the shadow mask during step (d).

37. The method of claim 3, wherein piezo electric materials are used to move the shadow mask during step (d).

38. The method of claim 3, wherein the device fabricated is a stacked organic light emitting device.

39. The method of claim 3, wherein the device fabricated is a stacked solar cell.

40. The method of claim 38, wherein the device fabricated is incorporated into a display.

41. The method of claim 40, wherein the display is incorporated into a product selected from the group consisting of: a vehicle, a television, a computer, a printer, a screen, a sign, a telecommunications product and a telephone.

42. The method of claim 38, wherein the device fabricated is incorporated into a printer.

* * * * *

UNITED STATES PATENT AND TRADEMARK OFFICE
CERTIFICATE OF CORRECTION

PATENT NO.   : 6,214,631 B1  
DATED        : April 10, 2001  
INVENTOR(S)  : Burrows et al.

It is certified that error appears in the above-identified patent and that said Letters Patent is hereby corrected as shown below:

Column 1,  
Line 6, after "Contract No.", change "f33615" to -- F33615 --;

Column 2,  
Line 12, after mask insert -- is --;

Column 4,  
Line 1, change "apertures" to -- aperture --;

Column 7,  
Line 13, after "electrodes," change "Le.," to -- i.e., --;  
Line 22, after "moved," change "is" to -- in --;  
Line 51, after "electrode 1230," change "an" to -- a --;

Column 8,  
Line 51, before "hexagons" change "a" to -- as --;

Column 13,  
Line 48, after "4,4'-bis" insert -- [N-(1-napthyl)-N-phenyl-amino] --;

Column 15,  
Line 56, change "herein" to -- wherein --; and

Column 16,  
Line 51, change "herein" to -- wherein --.

Signed and Sealed this

Twenty-first Day of May, 2002

Attest:

JAMES E. ROGAN  
*Director of the United States Patent and Trademark Office*

*Attesting Officer*